US012727288B2

(12) United States Patent
Cha et al.

(10) Patent No.: US 12,727,288 B2
(45) Date of Patent: Sep. 1, 2026

(54) DISPLAY DEVICE AND METHOD FOR REPAIRING SAME

(71) Applicant: SAMSUNG DISPLAY CO., LTD., Yongin-si (KR)

(72) Inventors: Jong Hwan Cha, Yongin-si (KR); Ki Nyeng Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 912 days.

(21) Appl. No.: 17/996,906

(22) PCT Filed: Jun. 23, 2020

(86) PCT No.: PCT/KR2020/008195
§ 371 (c)(1),
(2) Date: Oct. 21, 2022

(87) PCT Pub. No.: WO2021/215581
PCT Pub. Date: Oct. 28, 2021

(65) Prior Publication Data

US 2023/0246133 A1 Aug. 3, 2023

(30) Foreign Application Priority Data

Apr. 24, 2020 (KR) ........................ 10-2020-0049849

(51) Int. Cl.
*H10H 20/83* (2025.01)
*H10H 20/831* (2025.01)
(Continued)

(52) U.S. Cl.
CPC ........ *H10H 20/831* (2025.01); *H10H 20/857* (2025.01); *H10W 90/00* (2026.01); *H10H 20/032* (2025.01); *H10H 20/0364* (2025.01)

(58) Field of Classification Search
CPC ... H10H 20/0145; H10H 20/826–8262; H10H 20/013–0137;
(Continued)

(56) References Cited

U.S. PATENT DOCUMENTS 5,517,341 A 5/1996 Kim et al.
5,686,977 A 11/1997 Kim et al.
(Continued)

FOREIGN PATENT DOCUMENTS

CN 1142057 A 2/1997
CN 1225778 A 8/1999
(Continued)

OTHER PUBLICATIONS

International Search Report of PCT/KR2020/008195, Jan. 22, 2021 with English Translation 6 pp.
(Continued)

*Primary Examiner* — Moin M Rahman
(74) *Attorney, Agent, or Firm* — Womble Bond Dickinson (US) LLP

(57) ABSTRACT

A display device and a method of repairing the same, where the display device includes a substrate, a first electrode, a second electrode, and a third electrode on the substrate and sequentially arranged along a first direction, at least one first light emitting element between the first electrode and the second electrode, at least one second light emitting element between the second electrode and the third electrode, a first contact electrode that is in contact with the first electrode and one end of the first light emitting element, a second contact electrode having one side that is in contact with another end of the first light emitting element and another side that is in contact with the third electrode and one end of the second light emitting element, a third contact electrode
(Continued)

that is in contact with the second electrode and another end of the second light emitting element.

5 Claims, 30 Drawing Sheets

(51) Int. Cl.
*H10H 20/857* (2025.01)
*H10W 90/00* (2026.01)
*H10H 20/01* (2025.01)

(58) Field of Classification Search
CPC ...... H10H 20/824–8252; H10H 20/012–0125; H10H 20/823–8232; H10H 20/0165; H10H 20/817–818; H10H 20/052; H10H 20/814–8142; H10H 20/8312; H10H 20/01; H10H 20/857; H10H 20/032; H10H 20/0364; H10H 20/0363; H10H 20/855; H10H 20/819; H10H 20/856; H10H 20/82; H10H 20/831; H10H 29/142; H10H 20/821; H10H 20/84; H10H 20/042; H10H 20/83; H10H 29/10; G02F 1/133305; G02F 1/133388; G02F 1/13452; G02F 1/136254; G02F 2201/50; G02F 2202/28; H10K 50/844; H10K 59/873; H10K 77/111; H10K 59/131; H10K 59/129; H10K 2102/311; H10K 2102/361; H01L 2224/73204; H01L 25/167; H01L 25/0753; H01L 2224/0344; H01L 25/075; Y02E 10/549; G09G 2300/0426; G09G 3/32; G09G 2330/08; H10D 86/00; H10D 86/441; H10D 86/451
See application file for complete search history.

(56) References Cited

U.S. PATENT DOCUMENTS 5,696,566 A 12/1997 Kim et al.
5,841,428 A 11/1998 Jaeger et al.
5,847,780 A 12/1998 Kim et al.
5,936,613 A 8/1999 Jaeger et al.
5,949,581 A 9/1999 Kurtenbach et al.
5,995,178 A 11/1999 Fujikawa et al.
6,100,948 A 8/2000 Kim et al.
6,169,632 B1 1/2001 Kurtenbach et al.
6,504,551 B1 1/2003 Takashima et al.
6,573,532 B2 6/2003 Park
6,577,366 B1 6/2003 Kim et al.
6,954,498 B1 10/2005 Lipton
7,045,438 B2 5/2006 Yamazaki et al.
7,148,127 B2 12/2006 Oohata et al.
7,279,370 B2 10/2007 Lim et al.
7,339,564 B2 3/2008 Hashimoto et al.
7,389,420 B2 6/2008 Tian
7,636,077 B2 12/2009 Wei et al.
7,723,764 B2 5/2010 Oohata et al.
7,839,077 B2 11/2010 Kim
8,208,629 B2 6/2012 Xie et al.
8,217,571 B2 7/2012 Lee et al.
8,368,779 B2 2/2013 Manabe
8,395,160 B2* 3/2013 Park ................ H10K 59/80517 349/39
8,416,359 B2 4/2013 Choi et al.
8,599,108 B2 12/2013 Kline et al.
8,803,766 B2 8/2014 Kline et al.
8,866,985 B2 10/2014 Zhuang et al.
8,913,091 B2 12/2014 Iida et al.
9,007,449 B2 4/2015 Mitani et al.
9,064,319 B2 6/2015 Hong et al.
9,207,904 B2 12/2015 Hall
9,223,159 B2 12/2015 Takiguchi et al.
9,252,375 B2 2/2016 Bibl et al.
9,535,523 B2 1/2017 Kim et al.
9,972,549 B2 5/2018 Wu et al.
10,026,777 B2 7/2018 Kang et al.
10,096,277 B2 10/2018 Hsu
10,147,908 B2 12/2018 Chen
10,304,169 B2 5/2019 Chen
10,312,374 B2 6/2019 Itoh
10,388,905 B2 8/2019 Choi et al.
10,852,601 B2 12/2020 Chien
10,862,000 B2 12/2020 Min et al.
2004/0169777 A1 9/2004 Tanaka et al.
2005/0275352 A1 12/2005 Sun
2011/0089850 A1 4/2011 Shibata et al.
2017/0287188 A1 10/2017 Liu et al.
2018/0175106 A1* 6/2018 Kim .................... H10H 20/819
2019/0157340 A1 5/2019 Liao et al.
2021/0249392 A1 8/2021 Woo et al.
2021/0320231 A1 10/2021 Kim et al.
2022/0077227 A1 3/2022 Kang et al.

FOREIGN PATENT DOCUMENTS

CN 1244682 A 2/2000
CN 1252532 A 5/2000
CN 1304055 A 7/2001
CN 1359020 A 7/2002
CN 1451996 A 10/2003
CN 1527268 A 9/2004
CN 1536396 A 10/2004
CN 1537256 A 10/2004
CN 1564962 A 1/2005
CN 1582451 A 2/2005
CN 1605918 A 4/2005
CN 1620206 A 5/2005
CN 1805798 A 7/2006
CN 1858841 A 11/2006
CN 1921560 A 2/2007
CN 1925702 A 3/2007
CN 1945839 A 4/2007
CN 1949863 A 4/2007
CN 1957385 A 5/2007
CN 101039758 A 9/2007
CN 101061382 A 10/2007
CN 101114655 A 1/2008
CN 101202299 A 6/2008
CN 101211080 A 7/2008
CN 101239008 A 8/2008
CN 101299799 A 11/2008
CN 101375315 A 2/2009
CN 101441372 A 5/2009
CN 101482679 A 7/2009
CN 101548874 A 10/2009
CN 101661615 A 3/2010
CN 101682780 A 3/2010
CN 101694582 A 4/2010
CN 101852616 A 10/2010
CN 101960579 A 1/2011
CN 102096795 A 6/2011
CN 102117546 A 7/2011
CN 102159155 A 8/2011
CN 102169267 A 8/2011
CN 102181984 A 9/2011
CN 102301407 A 12/2011
CN 102326192 A 1/2012
CN 102607815 A 7/2012
CN 102620912 A 8/2012
CN 102621056 A 8/2012
CN 102750584 A 10/2012
CN 102842132 A 12/2012
CN 103096106 A 5/2013
CN 103176607 A 6/2013
CN 103234976 A 8/2013
CN 103403610 A 11/2013
CN 103455984 A 12/2013
CN 103528617 A 1/2014
CN 103592681 A 2/2014

(56) References Cited

FOREIGN PATENT DOCUMENTS

| | | | |
|---|---|---|---|
| CN | 103680326 | A | 3/2014 |
| CN | 103761534 | A | 4/2014 |
| CN | 103870056 | A | 6/2014 |
| CN | 103872667 | A | 6/2014 |
| CN | 103885262 | A | 6/2014 |
| CN | 103971338 | A | 8/2014 |
| CN | 103993547 | A | 8/2014 |
| CN | 104077563 | A | 10/2014 |
| CN | 104084379 | A | 10/2014 |
| CN | 104346608 | A | 2/2015 |
| CN | 104636701 | A | 5/2015 |
| CN | 104657940 | A | 5/2015 |
| CN | 104685556 | A | 6/2015 |
| CN | 104898662 | A | 9/2015 |
| CN | 105023249 | A | 11/2015 |
| CN | 105679798 | A | 6/2016 |
| CN | 105690764 | A | 6/2016 |
| CN | 105719250 | A | 6/2016 |
| CN | 105763812 | A | 7/2016 |
| CN | 105872532 | A | 8/2016 |
| CN | 106757681 | A | 5/2017 |
| CN | 106941135 | A | 7/2017 |
| CN | 106950758 | A | 7/2017 |
| CN | 106971688 | A | 7/2017 |
| CN | 107696499 | A | 2/2018 |
| CN | 110581200 | A | 12/2019 |
| JP | 2011-086758 | A | 4/2011 |
| JP | 2020-008751 | A | 1/2020 |
| KR | 10-0158641 | B1 | 12/1998 |
| KR | 10-1577227 | B1 | 12/2015 |
| KR | 10-2017-0049117 | A | 5/2017 |
| KR | 10-2018-0071465 | A | 6/2018 |
| KR | 10-2018-0077767 | A | 7/2018 |
| KR | 10-2020-0013824 | A | 2/2020 |
| KR | 10-2020-0079379 | A | 7/2020 |
| KR | 10-2021-0102560 | A | 8/2021 |
| WO | WO 2003/032067 | A1 | 4/2003 |
| WO | WO 2003/042895 | A1 | 5/2003 |
| WO | WO 2004/111289 | A2 | 12/2004 |
| WO | WO 2005/116961 | A1 | 12/2005 |
| WO | WO 2006/021219 | A1 | 3/2006 |
| WO | WO 2007/085950 | A2 | 8/2007 |
| WO | WO 2008/153300 | A1 | 12/2008 |
| WO | WO 2010/031404 | A1 | 3/2010 |
| WO | WO 2010/077865 | A2 | 7/2010 |
| WO | WO 2010/098368 | A1 | 9/2010 |

OTHER PUBLICATIONS

Written Opinion of PCT/KR2020/008195, Jan. 22, 2021 with English Translation, 6 pp.

* cited by examiner

PSV
INS4
INS3
INS2
INS1
SUB
I'
ELT3
CP
CL
CNE2
EP1
LD2
CNT2
BRP2
PL2_2
PL2_1
EP2
CNE3
PW3
PW2
ELT2
PAS3
CNE2
PAS2
EP2
LD1
EP1
PAS1
CNE1
ELT1
PW1
CNT1
BRP1
ET2
SCL
GE
ET1
T2
BML1
T1
I
LDL
PCL
Z

PSV
INS4
INS3
INS2
INS1
SUB
II'
ELT3
CP1
CL
CE
CNE2
EP1
LD2
EP2
CNT2
BRP2
PL2_2
PL2_1
CNE3
ELT2
PW3
PW2
PW1
CNE2
PAS3
EP2
PAS2
LD1
EP1
PAS1
CNE1
ELT1
CNT1
BRP1
ET2
SCL
GE
ET1
T2
BML1
T1
II
LDL
PCL
Z

DISPLAY DEVICE AND METHOD FOR REPAIRING SAME

CROSS-REFERENCE TO RELATED APPLICATIONS

This application is a U.S. National Phase Patent Application of International Patent Application Number PCT/KR2020/008195, filed on Jun. 23, 2020, which claims priority to Korean Patent Application Number 10-2020-0049849, filed on Apr. 24, 2020, the entire contents of all of which are incorporated by reference herein.

BACKGROUND

1. Field

The present disclosure relates to a display device and a method of repairing the same.

2. Description of the Related Art

In recent years, interest in information display is being increased. Accordingly, research and development of display devices is being continuously conducted.

SUMMARY

Aspects and features of embodiments of the present disclosure is to provide a display device having improved light emission efficiency by repairing a lighting defect of a pixel, and a method of repairing the display device.

Aspects and features of embodiments of the present disclosure is not limited to the aspects and features described above, and other technical aspects that are not described will be clearly understood by those skilled in the art from the following description.

According to one or more embodiments of the present disclosure, a display device includes a substrate, a first electrode, a second electrode, and a third electrode on the substrate and sequentially arranged along a first direction, at least one first light emitting element between the first electrode and the second electrode, at least one second light emitting element disposed between the second electrode and the third electrode, a first contact electrode that is in contact with the first electrode and one end of the first light emitting element, a second contact electrode having one side that is in contact with another end of the first light emitting element and another side that is in contact with the third electrode and one end of the second light emitting element, a third contact electrode that is in contact with the second electrode and another end of the second light emitting element, and at least one conductive pattern that is in contact with the third electrode and one end of the second light emitting element. The second contact electrode bypasses the third contact electrode and extends around the third contact electrode, and the conductive pattern is disconnected from the second contact electrode.

The second contact electrode and the conductive pattern may include a same conductive layer.

The conductive pattern may include a first conductive pattern and a second conductive pattern electrically separated from each other, and the display device may further include a connection electrode connecting the first conductive pattern and the second contact electrode.

One end of the connection electrode may be in contact with one end of the first conductive pattern, and another end of the connection electrode may be in contact with the second contact electrode.

The second electrode may include a first conductive layer, the second contact electrode may include a second conductive layer, the connection electrode may include a third conductive layer, and the second conductive layer may be between the first conductive layer and the third conductive layer.

According to one or more embodiments of the present disclosure, a display device includes a substrate, a first electrode, a second electrode, and a third electrode on the substrate and sequentially arranged along a first direction, at least one first light emitting element between the first electrode and the second electrode, at least one second light emitting element between the second electrode and the third electrode, a first contact electrode that is in contact with the first electrode and one end of the first light emitting element, a second contact electrode having one side that is in contact with another end of the first light emitting element and another end that is in contact with the third electrode and one end of the second light emitting element, and a third contact electrode that is in contact with the second electrode and another end of the second light emitting element. The second contact electrode includes a plurality of first areas spaced apart from each other, and at least one second area connecting at least two of the first areas.

The other end of the first light emitting element and the other end of the second light emitting element may include a semiconductor layer of a same type and oppose each other with the second electrode interposed therebetween.

The first light emitting element and the second light emitting element may be connected in series between the first electrode and the second electrode.

The second contact electrode may be spaced from the third contact electrode and may at least partially surround the third contact electrode in a plan view.

The first area and the second area may be integrally formed.

The display device may further include at least one conductive pattern that is in contact with the third electrode and the one end of the second light emitting element, and the conductive pattern may be disconnected from the first area.

According to one or more embodiments of the present disclosure, a method of repairing a display device including a substrate, and a first electrode, a second electrode, and a third electrode on the substrate and sequentially arranged along a first direction, at least one first light emitting element between the first electrode and the second electrode, at least one second light emitting element between the second electrode and the third electrode, a first contact electrode that is in contact with the first electrode and one end of the first light emitting element, a second contact electrode having one side that is in contact with another end of the first light emitting element and another side that is in contact with the third electrode and one end of the second light emitting element, a third contact electrode that is in contact with the second electrode and another end of the second light emitting element, and at least one conductive pattern that is in contact with the third electrode and one end of the second light emitting element. The second contact electrode bypasses the third contact electrode and extends around the third contact electrode, and the repair method comprises separating the second contact electrode and the conductive pattern.

The conductive pattern may include a first conductive pattern connected to a first sub light emitting element of the second light emitting element, and a second conductive pattern connected to a second sub light emitting element of the second light emitting element.

The method may further include separating the first conductive pattern and the second conductive pattern.

The method may further include forming a connection electrode connecting the first conductive pattern and the second contact electrode.

The first sub light emitting element may be electrically connected to the first electrode and the second electrode by the connection electrode.

The second contact electrode may include a plurality of first areas spaced apart from each other, and at least one second area connecting at least two of the first areas.

Separating the second contact electrode and the conductive pattern may include separating the first area and the conductive pattern.

A first sub light emitting element of the second light emitting element may be connected to the first area, and a second sub light emitting element of the second light emitting element may be connected to the conductive pattern.

The first sub light emitting element may be electrically connected to the first electrode and the second electrode by the first area and the second area.

The details of other embodiments are included in the detailed description and drawings.

According to one or more embodiments of the present disclosure, even though a defective light emitting element exists in a pixel, a lighting defect of the pixel may be repaired by disconnecting a conductive pattern connected to an end of the defective light emitting element from a contact electrode. In addition, because an end of a normal light emitting element may be connected through a contact electrode disposed to surround at least a portion of the normal light emitting element to be normally lit, a non-emission area due to repair may be reduced or minimized.

Effects, aspects, and features according to embodiments of the present disclosure are not limited by the contents exemplified above, and more various effects, aspects, and features are included in the present specification.

DETAILED DESCRIPTION

Figure 1:
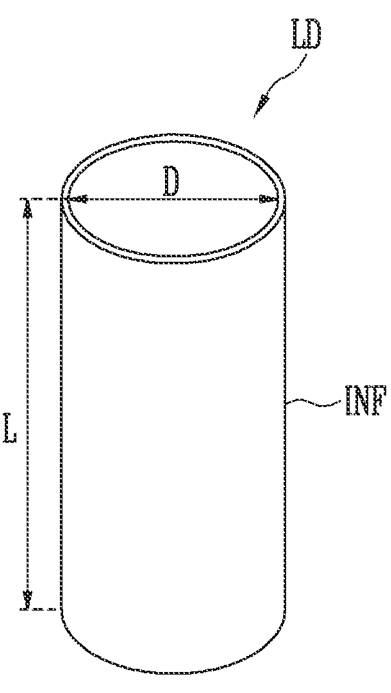
FIGS. 1 and 2 are perspective and cross-sectional views illustrating a light emitting element according to one or more embodiments.

The aspects and features of embodiments of the present disclosure and a method of achieving them will become apparent with reference to the embodiments described in detail below together with the accompanying drawings. However, the present disclosure is not limited to the embodiments disclosed below, may be implemented in various different forms, and the present embodiments are provided so that the present disclosure will be thorough and complete and those skilled in the art to which the present disclosure pertains can fully understand the scope of the present disclosure. The present disclosure is defined by the scope of the claims and their equivalents.

The terms used in the present specification are for describing embodiments and are not intended to limit the present disclosure. In the present specification, the singular form also includes the plural form unless otherwise specified. The term “comprises” and/or “comprising” does not exclude presence or addition of one or more other components, steps, operations, and/or elements to the described component, step, operation, and/or element.

In a case where a component is described as being “connected” or “coupled” to another component, the component may be directly connected to or coupled to the other component. However, it will be understood that another component may be “interposed” between each component or each component may be “connected” or “coupled” through another component.

A case in which an element or a layer is referred to as “on” another element or layer includes a case in which another layer or another element is disposed directly on the other element or between the other layers. The same reference numeral refers to the same reference component throughout the specification.

Although a first, a second, and the like are used to describe various components, these components are not limited by these terms. These terms are used only to distinguish one component from another component. Therefore, a first component described below may be a second component within the technical spirit of the present disclosure.

Hereinafter, embodiments of the present disclosure will be described in detail with reference to the accompanying drawings.

Figure 2:
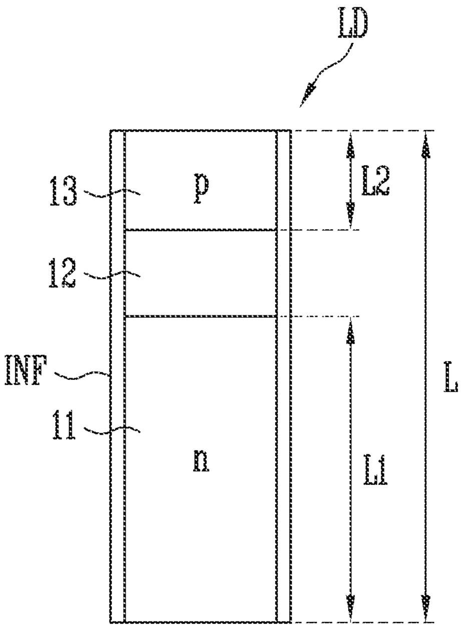

FIGS. 1 and 2 are perspective and cross-sectional views illustrating a light emitting element according to one or more embodiments. Although a rod shape light emitting element LD of a cylindrical shape is shown in FIGS. 1 and 2, a type and/or a shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be configured as a stack in which the first semiconductor layer 11, the active layer 12, and the second semiconductor layer 13 are sequentially stacked along one direction.

According to one or more embodiments, the light emitting element LD may be provided in a rod shape extending along one direction. The light emitting element LD may have one side end and another side end along the one direction.

According to one or more embodiments, one of the first and second semiconductor layers 11 and 13 may be disposed at the one side end of the light emitting element LD, and the other one of the first and second semiconductor layers 11 and 13 may be disposed at the other side end of the light emitting element LD.

According to one or more embodiments, the light emitting element LD may be a rod shape light emitting diode manufactured in a rod shape. Here, the rod shape encompasses a rod-like shape or a bar-like shape that is longer in a longitudinal direction than a width direction (that is, having an aspect ratio greater than 1), such as a cylinder or polygonal column, and the shape of a cross-section thereof is not particularly limited. For example, a length L of the light emitting element LD may be greater than a diameter D (or a width of the cross-section) thereof.

According to one or more embodiments, the light emitting element LD may have a size as small as a nano scale to a micro scale (e.g., nanometer scale to micrometer scale), for example, the diameter D and/or the length L of a range of about 100 nm to about 10 um. However, the size of the light emitting element LD is not limited thereto. For example, the size of the light emitting element LD may be variously changed according to a design condition of various devices using the light emitting element LD as a light source, for example, a display device or the like.

The first semiconductor layer 11 may include at least one n-type semiconductor material. For example, the first semiconductor layer 11 may include one semiconductor material from among InAlGaN, GaN, AlGaN, InGaN, AlN, and InN, and may include an n-type semiconductor material doped with a first conductive dopant such as Si, Ge, or Sn, but is not limited thereto.

The active layer 12 may be disposed on the first semiconductor layer 11 and may be formed in a single or multiple quantum well structure. In one or more embodiments, a clad layer doped with a conductive dopant may be formed on and/or under of the active layer 12. For example, the clad layer may be formed of an AlGaN layer or an InAlGaN layer. According to one or more embodiments, a material of AlGaN, AlIn—GaN, or the like may be used to form the active layer 12, and various materials other than the material described above may configure the active layer 12. The active layer 12 may be disposed between the first semiconductor layer 11 and the second semiconductor layer 13 that will be described later.

When a voltage greater than or equal to a threshold voltage is applied to both ends of the light emitting element LD, the light emitting element LD may emit light while electron-hole pairs are combined in the active layer 12. By controlling light emission of the light emitting element LD using this principle, the light emitting element LD may be used as a light source of various light emitting devices including a pixel of a display device.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor material doped with a second conductive dopant such as Mg. However, the material configuring the second semiconductor layer 13 is not limited thereto, and various materials other than the material described above may configure the second semiconductor layer 13.

According to one or more embodiments, a first length L1 of the first semiconductor layer 11 may be longer than a second length L2 of the second semiconductor layer 13.

According to one or more embodiments, the light emitting element LD may further include an insulating film INF provided on a surface (e.g., an outer peripheral or circumferential surface). The insulating film INF may be formed on the surface of the light emitting element LD to be around (e.g., to surround) at least an outer surface (e.g., an outer peripheral or circumferential surface) of the active layer 12, and may further surround one area of the first and second semiconductor layers 11 and 13.

According to one or more embodiments, the insulating film INF may expose the both ends of the light emitting element LD having different polarities. For example, the insulating film INF may not cover and may expose one ends of each of the first and second semiconductor layers 11 and 13 positioned at the both ends of the light emitting element LD on the longitudinal direction, for example, two planes (that is, an upper surface and a lower surface) of a cylinder. In one or more embodiments, the insulating film INF may expose the both ends of the light emitting element LD having different polarities and sides of the semiconductor layers 11 and 13 adjacent to the both ends.

According to one or more embodiment, the insulating film INF may include at least one insulating material from among silicon dioxide (SiO2), silicon nitride (Si3N4), aluminum oxide (Al2O3), and titanium dioxide (TiO2), but is not necessarily limited thereto.

In one or more embodiments, the light emitting element LD may further include an additional component in addition to the first semiconductor layer 11, the active layer 12, the second semiconductor layer 13, and/or the insulating film INF. For example, the light emitting element LD may additionally include one or more phosphor layers, active layers, semiconductor materials, and/or electrode layers disposed on one end side of the first semiconductor layer 11, the active layer 12, and/or the second semiconductor layer 13.

Figure 3:
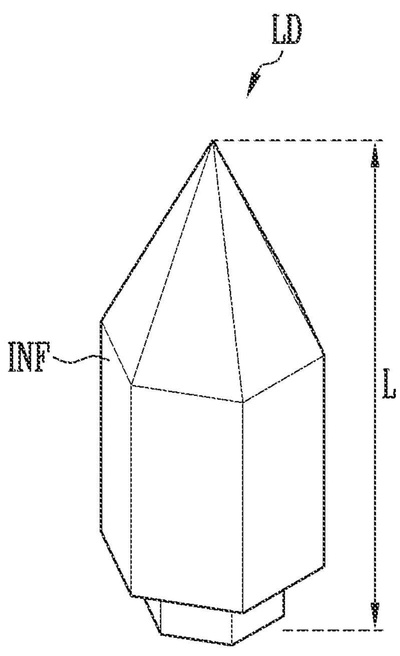
FIGS. 3 and 4 are perspective and cross-sectional views illustrating a light emitting element according to one or more embodiments.
Figure 4:
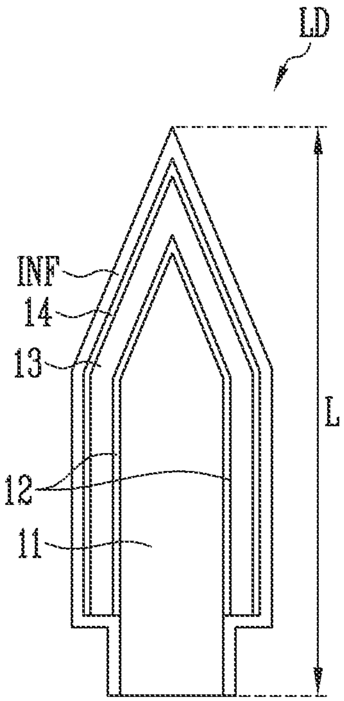

FIGS. 3 and 4 are perspective and cross-sectional views illustrating a light emitting element according to one or more embodiments.

Referring to FIGS. 3 and 4, the light emitting element LD according to one or more embodiments may include a first semiconductor layer 11, a second semiconductor layer 13, and an active layer 12 interposed between the first and second semiconductor layers 11 and 13. According to one or more embodiments, the first semiconductor layer 11 may be disposed in a center area (e.g., core) of the light emitting element LD, and the active layer 12 may be disposed on a surface (e.g., an outer peripheral or circumferential surface) of the first semiconductor layer 11 to be around (e.g., to surround) at least one area of the first semiconductor layer 11. In addition, the second semiconductor layer 13 may be disposed on a surface (e.g., an outer peripheral or circumferential surface) of the active layer 12 to be around (e.g., to surround) at least one area of the active layer 12.

In addition, the light emitting element LD may further include an electrode layer 14 and/or an insulating film INF around (e.g., surrounding) at least one area of the second semiconductor layer 13. For example, the light emitting element LD may include the electrode layer 14 disposed on a surface (e.g., an outer peripheral or circumferential surface) of the second semiconductor layer 13 to be around (e.g., to surround) one area of the second semiconductor layer 13, and the insulating film INF disposed on a surface (e.g., an outer peripheral or circumferential surface) of the electrode layer 14 to be around (e.g., to surround) at least one area of the electrode layer 14. That is, the light emitting element LD according to the above-described embodiment may be implemented as a core-shell structure including the first semiconductor layer 11, the active layer 12, the second semiconductor layer 13, the electrode layer 14, and the insulating film INF sequentially disposed in an outer direction from a center, and the electrode layer 14 and/or the insulating film INF may be omitted according to one or more embodiments.

In one or more embodiments, the light emitting element LD may be provided in a polygonal horn shape extending along any one direction. For example, at least one area of the light emitting element LD may have a hexagonal horn shape. However, a shape of the light emitting element LD is not limited thereto, and may be variously changed.

When an extension direction of the light emitting element LD is referred to as a length L direction, the light emitting element LD may have one side end and another side end along the length L direction. According to one or more embodiments, one of the first and second semiconductor layers 11 and 13 may be disposed at the one side end of the light emitting element LD, and the other one of the first and second semiconductor layers 11 and 13 may be disposed at the other side end of the light emitting element LD.

In one or more embodiments, the light emitting element LD may be an ultra-small light emitting diode of a core-shell structure manufactured in a polygonal column shape, for example, a hexagonal horn shape of which both ends are protruded. For example, the light emitting element LD may have a size as small as a nano scale to a micro scale, for example, a width and/or a length L of a range of a nano scale or a micro scale, respectively. However, a size, a shape, and/or the like of the light emitting element LD may be variously changed according to a design condition of various devices using the light emitting element as a light source, for example, a display device or the like.

In one or more embodiments, both ends of the first semiconductor layer 11 may have a protruding shape along the length L direction of the light emitting element LD. Shapes of the both ends of the first semiconductor layer 11 may be different from each other. For example, one end disposed on an upper side of the both ends of the first semiconductor layer 11 may have a horn shape contacting one vertex as a width narrows toward an upper portion. In addition, another end of the first semiconductor layer 11 disposed on a lower side of the both ends of the first semiconductor layer 11 may have a polygonal column shape having a constant width, but is not limited thereto. For example, in one or more embodiments, the first semiconductor layer 11 may have a cross-section of a polygonal shape, a step shape, or the like in which the width is gradually narrowed toward a lower portion. The shape of the both ends of the first semiconductor layer 11 may be variously changed according to one or more embodiments, and is not limited to the above-described embodiment.

According to one or more embodiments, the first semiconductor layer 11 may be positioned at a core, that is, a center (or a center area) of the light emitting element LD. In addition, the light emitting element LD may be provided in a shape corresponding to the shape of the first semiconductor layer 11. For example, when the first semiconductor layer 11 has a hexagonal horn shape, the light emitting element LD may have a hexagonal horn shape.

Figure 5:
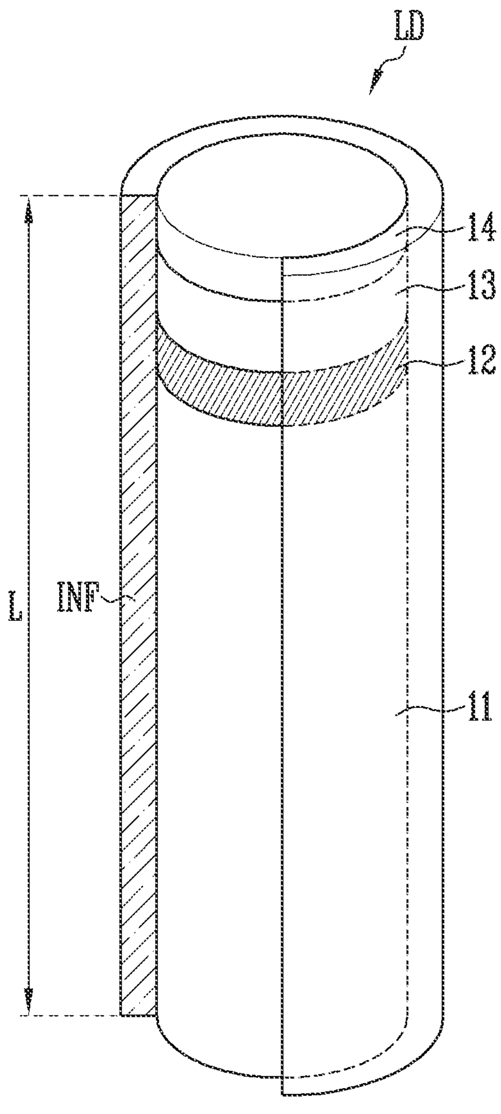
FIG. 5 is a perspective cutaway view illustrating a light emitting element according to one or more embodiments.

FIG. 5 is a perspective cutaway view illustrating a light emitting element according to one or more embodiments. In FIG. 5, a portion of the insulating film INF is omitted for convenience of description.

Referring to FIG. 5, the light emitting element LD may further include an electrode layer 14 disposed on the second semiconductor layer 13.

The electrode layer 14 may be an ohmic contact electrode electrically connected to the second semiconductor layer 13, but is not necessarily limited thereto. According to one or more embodiments, the electrode layer 14 may be a Schottky contact electrode. The electrode layer 14 may include a metal or a metal oxide, and for example, Cr, Ti, Al, Au, Ni, ITO, IZO, ITZO, and an oxide or an alloy thereof may be used alone or in combination. In addition, the electrode layer 14 may be substantially transparent or translucent. Therefore, light generated in the active layer 12 of the light emitting element LD may pass through the electrode layer 15 and may be emitted to the outside of the light emitting element LD.

In one or more embodiments, the light emitting element LD may further include an electrode layer disposed on the first semiconductor layer 11.

Figure 6:
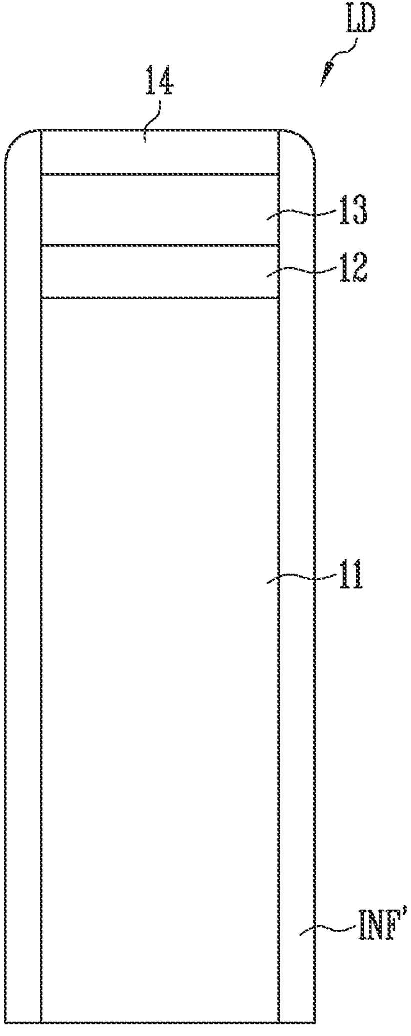
FIG. 6 is a cross-sectional view illustrating a light emitting element according to one or more embodiments.

FIG. 6 is a cross-sectional view illustrating a light emitting element according to one or more embodiments.

Referring to FIG. 6, an insulating film INF' may have a curved shape in a corner area adjacent to the electrode layer 14. According to one or more embodiments, the curved surface may be formed by etching in a manufacturing process of the light emitting element LD.

In one or more embodiments, in the light emitting element LD including an electrode layer disposed on the above-described first semiconductor layer 11, the insulating film INF' may have a curved shape in an area adjacent to the electrode layer.

Figure 7:
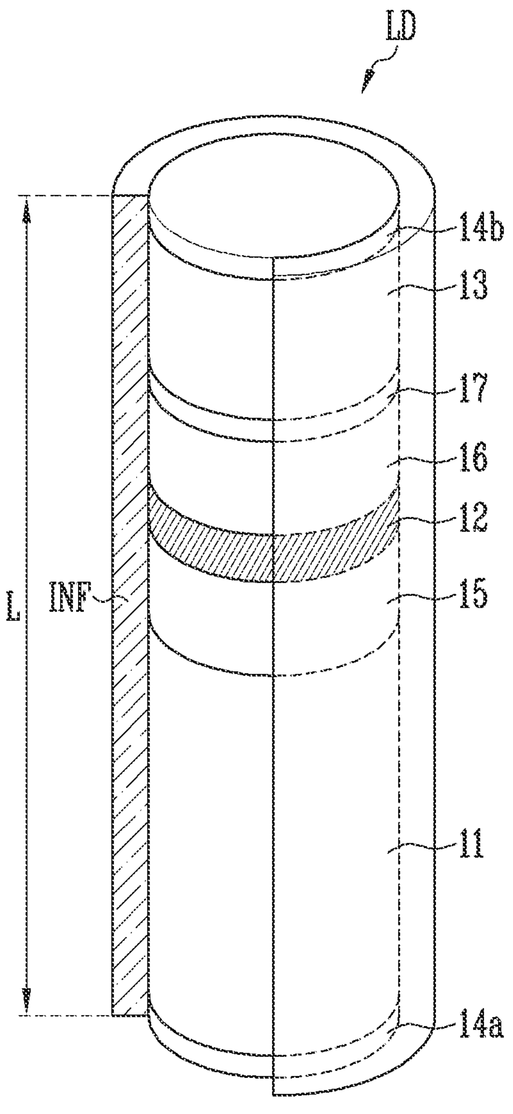
FIG. 7 is a perspective cutaway view illustrating a light emitting element according to one or more embodiments.

FIG. 7 is a perspective cutaway view illustrating a light emitting element according to one or more embodiments. In FIG. 7, a portion of the insulating film INF is omitted for convenience of description.

Referring to FIG. 7, the light emitting element LD may further include a third semiconductor layer 15 disposed between the first semiconductor layer 11 and the active layer 12, and a fourth semiconductor layer 16 and a fifth semiconductor layer 17 disposed between the active layer 12 and the second semiconductor layers 13. The light emitting element LD of FIG. 7 is different from the embodiment of FIG. 1, in that the plurality of semiconductor layers 15, 16, and 17 and electrode layers 14*a* and 14*b* are further disposed, and the active layer 12 includes another element. In addition, because a disposition and a structure of the insulating film INF are substantially the same as those of FIG. 1, an overlapping content is omitted and a different point is mainly described.

As described above, in the light emitting element LD of FIG. 1, the active layer 12 may emit blue or green light by including nitrogen (N). On the other hand, in the light emitting element LD of FIG. 7, each of the active layer 12 and the other semiconductor layers 11, 13, 15, 16, and 17 may be a semiconductor including at least phosphorus (P). That is, the light emitting element LD according to one or more embodiments may emit red light of which a center wavelength band has a range of 620 nm to 750 nm. However, it should be understood that the center wavelength band of the red light is not limited to the above-described range and includes all wavelength ranges that may be recognized as red in the present technical field.

Specifically, in the light emitting element LD according to the embodiment of FIG. 7, the first semiconductor layer 11 may be an n-type semiconductor layer, and when the light emitting element LD emits red light, the first semiconductor layer 11 may include a semiconductor material having a chemical formula of InxAlyGa1-x-yP (0≤x≤1, 0≤y≤1, 0≤x+y≤1). For example, the first semiconductor layer 11 may be any one or more of n-type doped InAlGaP, GaP, AlGaP, InGaP, AlP, and InP. The first semiconductor layer 11 may be doped with an n-type dopant, and for example, the n-type dopant may be Si, Ge, Sn, or the like. In one or more embodiments, the first semiconductor layer 11 may be n-AlGaInP doped with n-type Si. A length of the first semiconductor layer 11 may have a range of 1.5 um to Sum, but is not necessarily limited thereto.

The second semiconductor layer 13 may be a p-type semiconductor layer, and when the light emitting element LD emits red light, the second semiconductor layer 13 may include a semiconductor material having a chemical formula of InxAlyGa1-x-yP (0≤x≤1, 0≤y≤1, 0≤x+y≤1). For example, the second semiconductor layer 13 may be any one or more of p-type doped InAlGaP, GaP, AlGaNP, InGaP, AlP, and InP. The second semiconductor layer 13 may be doped with a p-type dopant, and for example, the p-type dopant may be Mg, Zn, Ca, Se, Ba, or the like. In one or more embodiments, the second semiconductor layer 13 may be p-GaP doped with p-type Mg. A length of the second semiconductor layer 13 may have a range of 0.08 um to 0.25 um, but is not necessarily limited thereto.

The active layer 12 may be disposed between the first semiconductor layer 11 and the second semiconductor layer 13. Similar to the active layer 12 of FIG. 1, the active layer 12 of FIG. 7 may also emit light of a specific wavelength band by including a single or multiple quantum well structure material. For example, when the active layer 12 emits light of a red wavelength band, the active layer 12 may include a material of AlGaP, AlInGaP, or the like. In particular, when the active layer 12 has a structure in which a quantum layer and a well layer are alternately stacked in a multiple quantum well structure, the quantum layer may include a material such as AlGaP or AlInGaP, and the well layer may include a material such as GaP or AlInP. In one or more embodiments, the active layer 12 may emit red light having a center wavelength band of 620 nm to 750 nm by including AlGaInP as the quantum layer and AlInP as the well layer.

The light emitting element LD of FIG. 7 may include a clad layer disposed adjacent to the active layer 12. As shown in the drawing, the third semiconductor layer 15 disposed between the first semiconductor layer 11 and the active layer 12 (e.g., under the active layer 12), and the fourth semiconductor layer 16 disposed between the active layer 12 and the second semiconductor layer 13 (e.g., on the active layer 12) may be clad layers.

The third semiconductor layer 15 may be disposed between the first semiconductor layer 11 and the active layer 12. The third semiconductor layer 15 may be an n-type semiconductor similar to the first semiconductor layer 11, and for example, the third semiconductor layer 15 may include a semiconductor material having a chemical formula of InxAlyGa1-x-yP (0≤x≤1, 0≤y≤1, 0≤x+y≤1). In one or more embodiments, the first semiconductor layer 11 may be n-AlGaInP, and the third semiconductor layer 15 may be n-AlInP, but are not necessarily limited thereto.

The fourth semiconductor layer 16 may be disposed between the active layer 12 and the second semiconductor layer 13. The fourth semiconductor layer 16 may be a p-type semiconductor similar to the second semiconductor layer 13, and for example, the fourth semiconductor layer 16 may include a semiconductor material having a chemical formula of InxAlyGa1-x-yP (0≤x≤1, 0≤y≤1, 0≤x+y≤1). In one or more embodiments, the second semiconductor layer 13 may be p-GaP, and the fourth semiconductor layer 16 may be p-AlInP.

The fifth semiconductor layer 17 may be disposed between the fourth semiconductor layer 16 and the second semiconductor layer 13. The fifth semiconductor layer 17 may be a p-doped semiconductor similar to the second semiconductor layer 13 and the fourth semiconductor layer 16. In one or more embodiments, the fifth semiconductor layer 17 may perform a function of reducing a lattice constant difference between the fourth semiconductor layer 16 and the second semiconductor layer 13. That is, the fifth semiconductor layer 17 may be a tensile strain barrier reducing (TSBR) layer. For example, the fifth semiconductor layer 17 may include p-GaInP, p-AlInP, p-AlGaInP, and the like, but is not limited thereto. In addition, a length of the third semiconductor layer 15, the fourth semiconductor layer 16, and the fifth semiconductor layer 17 may have a range of 0.08 um to 0.25 um, but is not limited thereto.

The first electrode layer 14*a* and the second electrode layer 14*b* may be disposed on the first semiconductor layer 11 and the second semiconductor layer 13, respectively. The first electrode layer 14*a* may be disposed on a lower surface of the first semiconductor layer 11, and the second electrode layer 14*b* may be disposed on an upper surface of the second semiconductor layer 13. However, the present disclosure is not limited thereto, at least one of the first electrode layer 14*a* and the second electrode layer 14*b* may be omitted. For example, in the light emitting element LD, the first electrode layer 14*a* may not be disposed on the lower surface of the first semiconductor layer 11, and only one second electrode layer 14*b* may be disposed on the upper surface of the second semiconductor layer 13. Each of the first electrode layer 14*a* and the second electrode layer 14*b* may include at least one of the materials exemplified in the electrode layer 14 of FIG. 5.

The following embodiments are described as an example to which the light emitting element LD shown in FIGS. 1 and 2 is applied, but a person skilled in the art may apply various shapes of light emitting elements including the light emitting element LD shown in FIGS. 3 to 7 to other embodiments.

Figure 8:
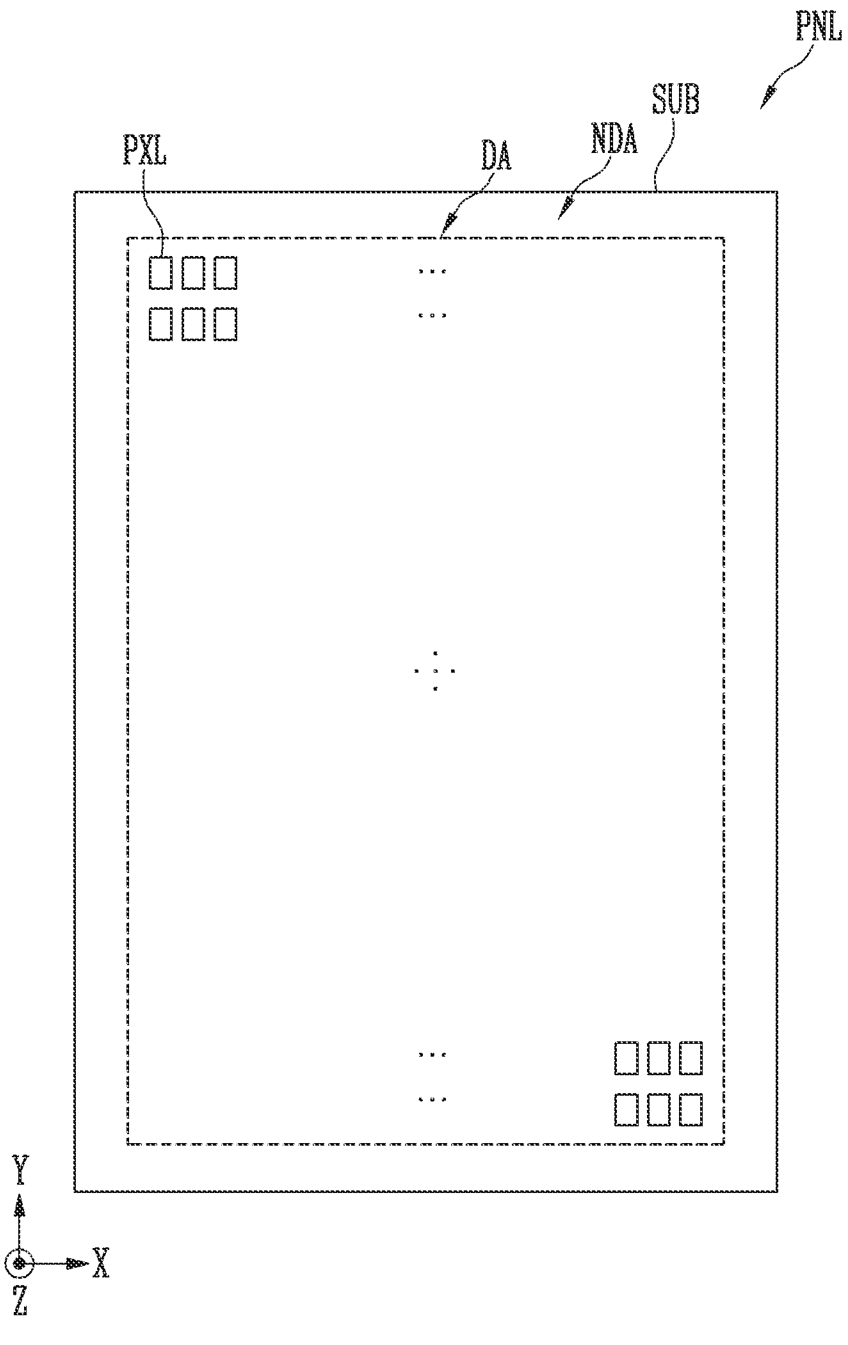
FIG. 8 is a plan view illustrating a display device according to one or more embodiments.

FIG. 8 is a plan view illustrating a display device according to one or more embodiments. FIG. 8 illustrates a display device, particularly, a display panel PNL provided in the display device, as an example of a device that may use the light emitting element LD described with reference to FIGS. 1 to 7 as a light source. Referring to FIG. 8, the display panel PNL may include a substrate SUB and a plurality of pixels PXL defined on the substrate SUB. Specifically, the display panel PNL and the substrate SUB may include a display area DA in which an image is displayed and a non-display area NDA excluding the display area DA.

According to one or more embodiments, the display area DA may be disposed in a central area of the display panel PNL, and the non-display area NDA may be disposed along an edge or periphery of the display panel PNL to be around (e.g., to surround) the display area DA. However, positions of the display area DA and the non-display area NDA are not limited thereto, and the positions thereof may be changed.

The substrate SUB may configure a base member of the display panel PNL. For example, the substrate SUB may configure a base member of a lower panel (for example, a lower plate of the display panel PNL).

According to one or more embodiments, the substrate SUB may be a rigid substrate or a flexible substrate, and a material or a physical property thereof is not particularly limited. For example, the substrate SUB may be a rigid substrate configured of glass or tempered glass, or a flexible substrate configured of a thin film of a plastic or metal material. In addition, the substrate SUB may be a transparent substrate, but is not limited thereto. For example, the substrate SUB may be a translucent substrate, an opaque substrate, or a reflective substrate.

One area on the substrate SUB is defined as the display area DA so that the pixels PXL are disposed, and the remaining area is defined as the non-display area NDA. For example, the substrate SUB may include the display area DA including a plurality of pixel areas in which the pixels PXL are formed and the non-display area NDA disposed outside the display area DA. In the non-display area NDA, various lines connected to the pixels PXL of the display area DA, and/or an internal circuit unit may be disposed.

The pixels PXL may include at least one light emitting element LD driven by corresponding scan signal and data signal, for example, at least one rod shape light emitting diode according to any one of the embodiments of FIGS. 1 to 7. For example, each of the pixels PXL may include a plurality of rod shape light emitting diodes having a size as small as a nano scale to a micro scale and connected in parallel or in series with each other. The plurality of rod shape light emitting diodes may configure a light source of the pixels PXL.

FIG. 8 shows an embodiment in which the pixels PXL are arranged in a stripe shape in the display area DA, but the present disclosure is not necessarily limited thereto, and the pixels PXL may be disposed in various pixel arrangement types such as PENTILE®. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, the pixels PXL may be arranged in various other currently known suitable pixel arrangement shapes.

FIGS. 9 to 13 are circuit diagrams illustrating an example of the pixel of FIG. 8.

Figure 9:
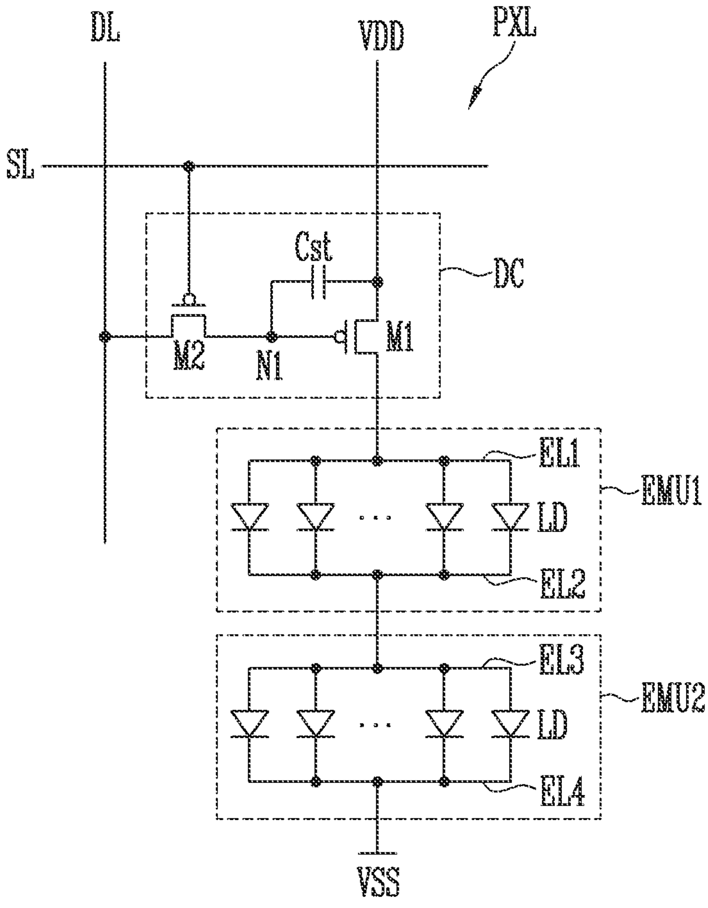
FIGS. 9 to 13 are circuit diagrams illustrating an example of a pixel of FIG. 8.

First, referring to FIG. 9, each of the pixels PXL may include light emitting units EMU1 and EMU2 and a pixel driving circuit DC connected thereto to drive the light emitting units EMU1 and EMU2.

The light emitting units EMU1 and EMU2 may be connected in series between a first power VDD (or a first driving power) and a second power VSS (or a second driving power). Each of the light emitting units EMU1 and EMU2 may include a plurality of light emitting elements LD connected in parallel between the first power VDD (or a first power line to which the first power VDD is applied) and the second power VSS (or a second power line to which the second power VSS is applied).

The first light emitting unit EMU1 may include a first electrode EL1 (or a first alignment electrode) connected to the first power VDD via the pixel driving circuit DC, a second electrode EL2 (or a second alignment electrode) connected to the second power VSS via the second light emitting unit EMU2, and a plurality of light emitting elements LD connected in parallel in the same direction between the first and second electrodes EL1 and EL2. For example, the first electrode EL1 may be an anode electrode, and the second electrode EL2 may be a cathode electrode.

Similarly, the second light emitting unit EMU2 may include a third electrode EL3 (or a third alignment electrode) connected to the first power VDD via the first light emitting unit EMU1, a fourth electrode EL4 (or a fourth alignment electrode) connected to the second power VSS, and a plurality of light emitting elements LD connected in parallel in the same direction between the third and fourth electrodes EL3 and EL4. For example, the third electrode EL3 may be an anode electrode, and the fourth electrode EL4 may be a cathode electrode.

Each of the light emitting elements LD included in the light emitting units EMU1 and EMU2 may include a first end connected to the first power VDD through the first electrode EL1 (or the third electrode EL3), and a second end connected to the second power VSS through the second electrode EL2 (or the fourth electrode EL4). The first power VDD may be set as high potential power, and the second power VSS may be set as low potential power. Here, a potential difference between the first and second power VDD and VSS may be set to be greater than or equal to a threshold voltage of the light emitting elements LD during an emission period of the pixel PXL.

As described above, each of the light emitting elements LD connected in parallel in the same direction (for example, a forward direction) between the first electrode EL1 and the second electrode EL2 to which voltages of different potentials are respectively supplied may configure an effective light source.

The light emitting elements LD of the light emitting units EMU1 and EMU2 may emit light with a luminance corresponding to a driving current supplied through the corresponding pixel driving circuit DC. For example, during each frame period, the pixel driving circuit DC may supply a driving current corresponding to a grayscale value of a corresponding frame data to the light emitting units EMU1 and EMU2. The driving current supplied to the light emitting units EMU1 and EMU2 may be divided and may flow through the light emitting elements LD connected in the same direction. Accordingly, the light emitting units EMU1 and EMU2 may emit light of a luminance corresponding to the driving current while each light emitting element LD emits light with a luminance corresponding to a current flowing therethough.

In one or more embodiments, the pixel driving circuit DC may include a first transistor M1, a second transistor M2, and a storage capacitor Cst.

A first electrode of the first transistor M1 (e.g., a driving transistor) may be connected to the first power VDD, and a second electrode of the first transistor M1 may be electrically connected to a first electrode (for example, an anode electrode) of the light emitting element LD. A gate electrode of the first transistor M1 may be connected to a first node N1. The first transistor M1 may control a driving current amount supplied to the light emitting elements LD in response to a voltage of the first node N1.

A first electrode of the second transistor M2 (e.g., a switching transistor) may be connected to a data line DL, and a second electrode of the second transistor M2 may be connected to the first node N1. Here, the first electrode and the second electrode of the second transistor M2 may be different electrodes, and for example, when the first electrode is a source electrode, the second electrode may be a drain electrode. A gate electrode of the second transistor M2 may be connected to a scan line SL.

The second transistor M2 may be turned on when a scan signal of a voltage (for example, a gate on voltage) at which the first transistor M1 may be turned on is supplied from the scan line SL, to electrically connect data line DL and the first node N1 to each other. At this time, a data signal of a corresponding frame may be supplied to the data line DL, and thus the data signal may be transmitted to the first node N1. The data signal transmitted to the first node N1 may be stored in the storage capacitor Cst.

One electrode of the storage capacitor Cst may be connected to the first power VDD, and another electrode of the storage capacitor Cst may be connected to the first node N1. The storage capacitor Cst may be charged with a voltage corresponding to the data signal supplied to the first node N1, and may maintain the charged voltage until the data signal of a next frame is supplied.

For convenience of description, FIG. 9 shows the driving circuit DC of a relatively simple structure, which includes the second transistor M2 for transmitting the data signal into each pixel PXL, the storage capacitor Cst for storing the data signal, and the first transistor M1 for supplying the driving current corresponding to the data signal to the light emitting element LD. However, the present disclosure is not necessarily limited thereto, and a structure of the driving circuit DC may be variously modified and implemented. For example, the driving circuit DC may further include other circuit elements such as various transistors such as a compensation transistor for compensating for a threshold voltage of the first transistor M1, an initialization transistor for initializing the first node N1, and/or an emission control transistor for controlling an emission time of the light emitting element LD, and a boosting capacitor for boosting the voltage of the first node N1.

Figure 10:
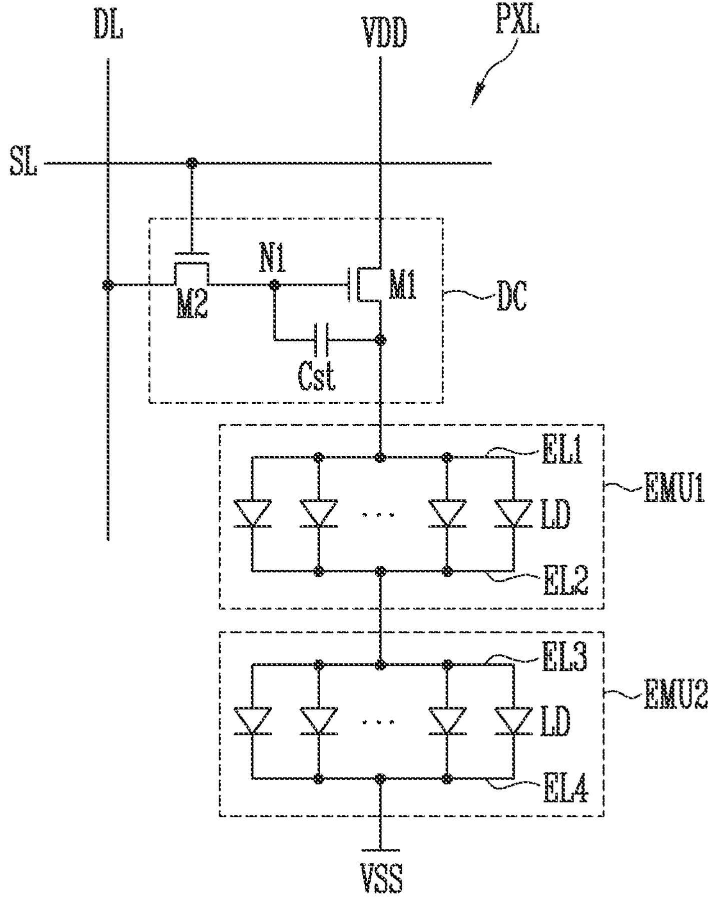

In addition, in FIG. 9, all of the transistors included in the driving circuit DC, for example, the first and second transistors M1 and M2 are P-type transistors, but are not necessarily limited thereto. That is, at least one of the first and second transistors M1 and M2 included in the driving circuit DC may be changed to an N-type transistor. For example, as shown in FIG. 10, the first and second transistors M1 and M2 of the driving circuit DC may be implemented as N-type transistors. Because a configuration or an operation of a driving circuit DC shown in FIG. 10 may be similar to that of the driving circuit DC of FIG. 9 except for a connection position change of some components due to a transistor type change, a detailed description thereof is omitted.

Figure 11:
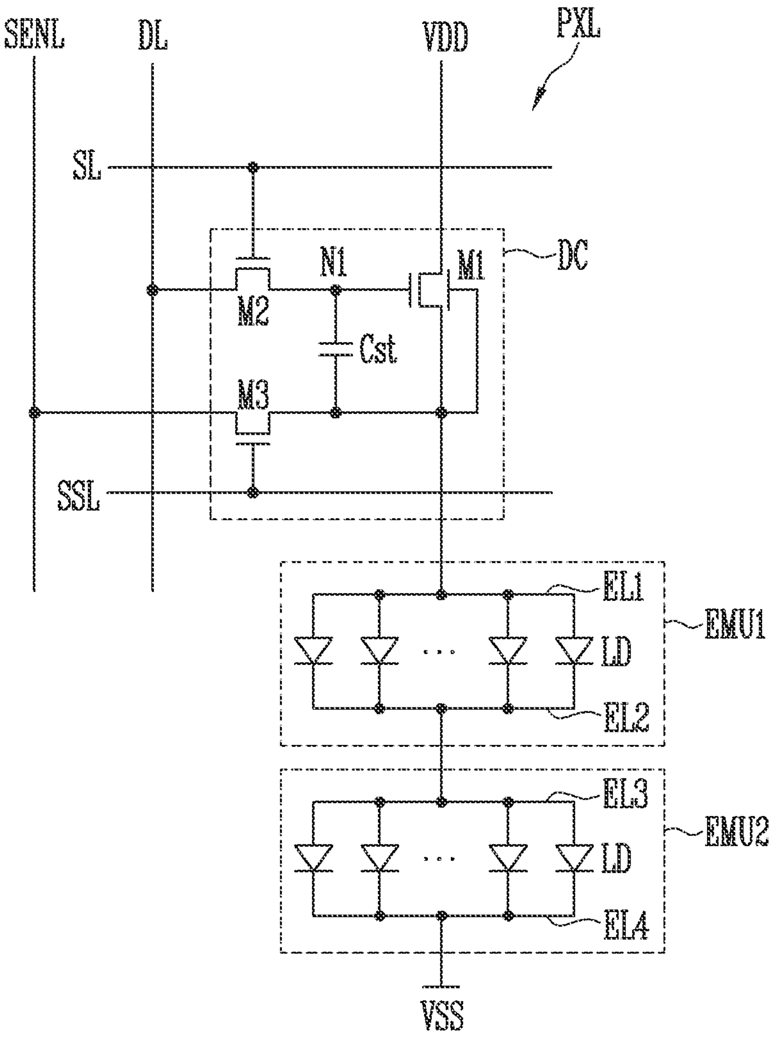

In addition, referring to FIG. 11, the pixel PXL may further include a third transistor M3 (e.g., a sensing transistor). A gate electrode of the third transistor M3 may be connected to a sensing signal line SSL. One electrode of the third transistor M3 may be connected to a sensing line SENL, and another electrode of the third transistor M3 may be connected to the anode electrode of the light emitting element LD. The third transistor M3 may transmit a voltage value at the anode electrode of the light emitting element LD to the sensing line SENL according to a sensing signal supplied to the sensing signal line SSL during a sensing period. The voltage value transmitted through the sensing line SENL may be provided to an external circuit (for example, a timing controller), and the external circuit may extract characteristic information (for example, a threshold voltage or the like of the first transistor M1) of the pixel PXL, based on the provided voltage value. The extracted characteristic information may be used to convert image data so that a characteristic deviation of the pixel PXL is compensated.

In addition, in one or more embodiments, the first transistor M1 may further include a back gate electrode connected to the first electrode EL1. The back gate electrode may be disposed to overlap the gate electrode with an insulating layer interposed therebetween, may configure a body of the first transistor M1, and may function as a gate electrode.

Figure 12:
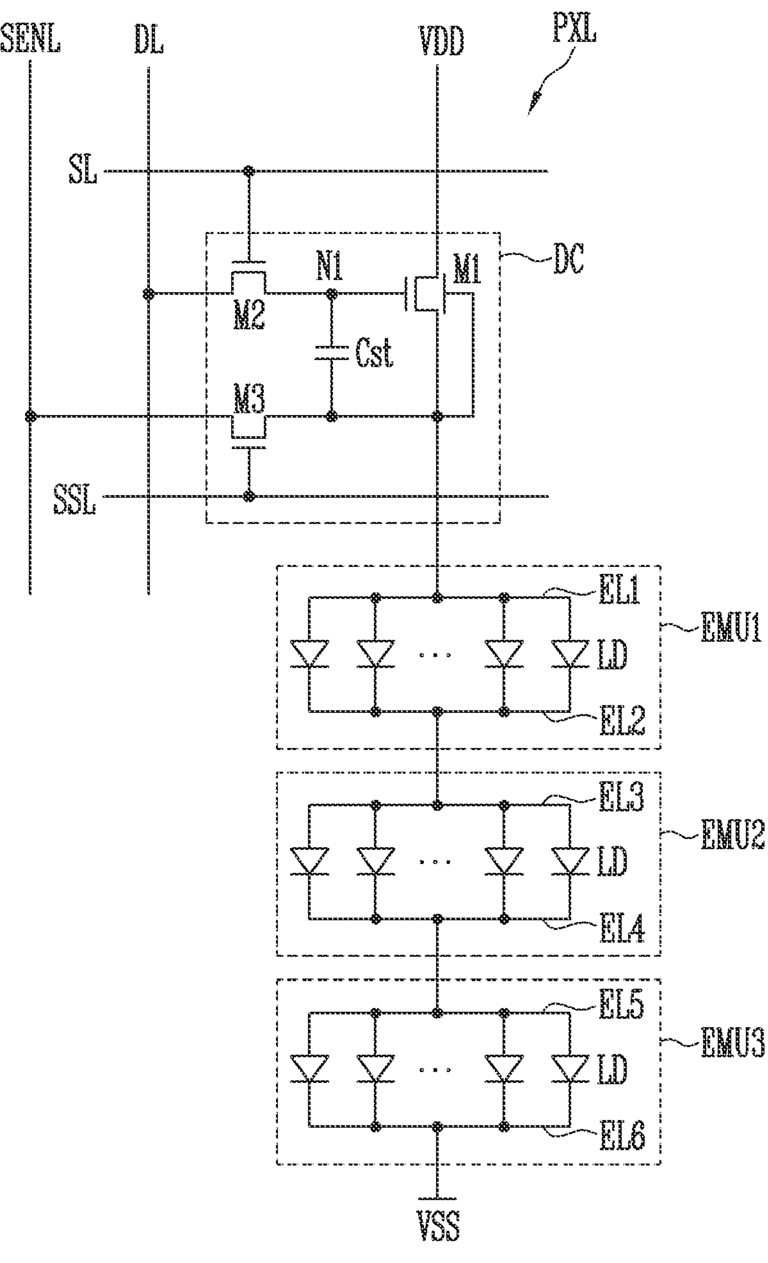

In FIGS. 9 to 11, the pixel PXL includes two light emitting units EMU1 and EMU2, but is not necessarily limited thereto. For example, as shown in FIG. 12, the pixel PXL may further include a third light emitting unit EMU3 in addition to the first and second light emitting units EMU1 and EMU2. The first to third light emitting units EMU1, EMU2, and EMU3 may be connected in series between the first power VDD and the second power VSS.

The third light emitting unit EMU3 may include a fifth electrode EL5 (or a fifth alignment electrode) connected to the first power VDD via the pixel driving circuit DC (and the first and second light emitting units EMU1 and EMU2), a sixth electrode EL6 (or a sixth alignment electrode) connected to the second power VSS, and a plurality of light emitting elements LD connected in parallel in the same direction between the fifth and sixth electrodes EL5 and EL6. For example, the fifth electrode EL5 may be an anode electrode, and the sixth electrode EL6 may be a cathode electrode.

Figure 13:
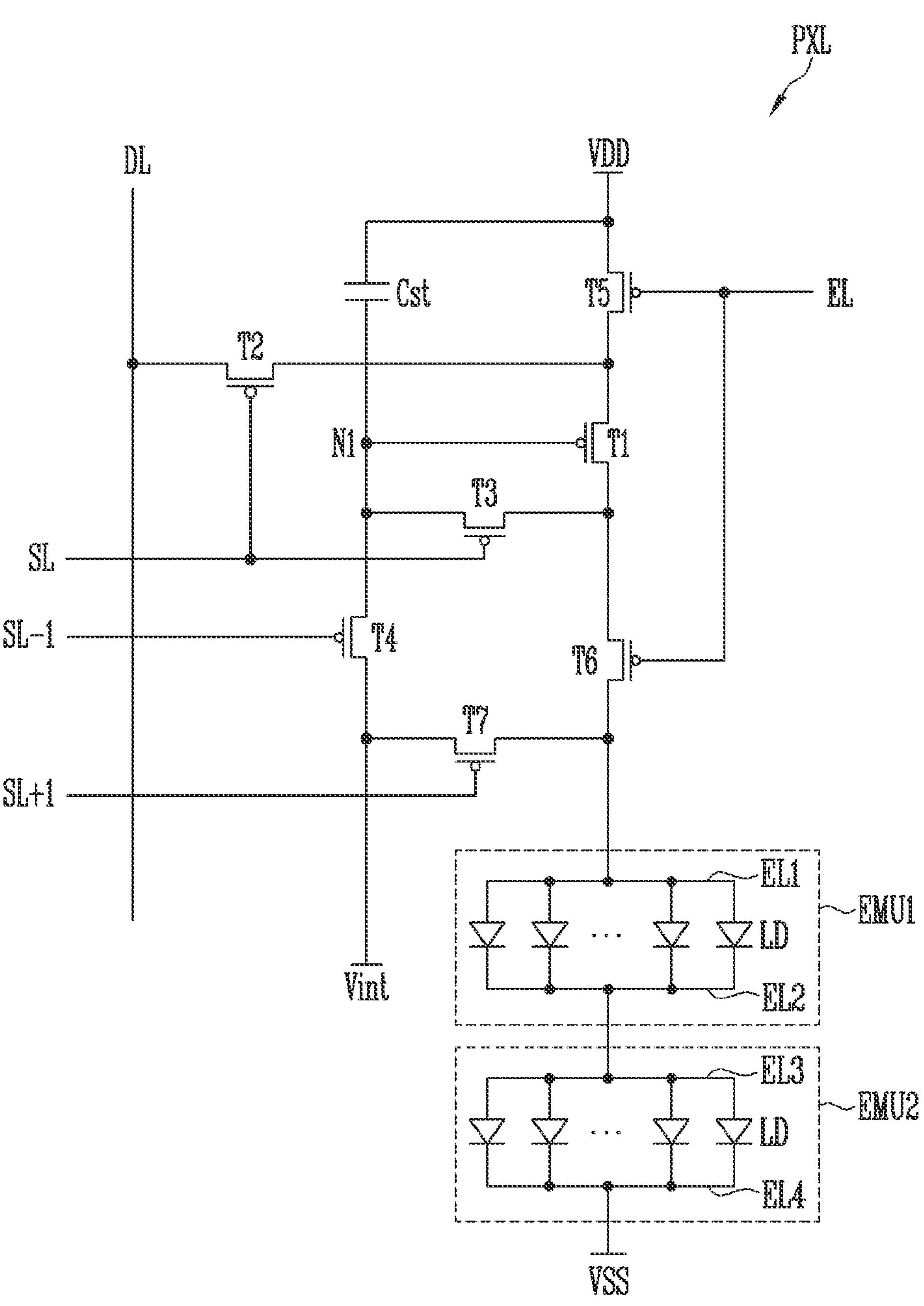

In addition, referring to FIG. 13, the pixel PXL may include a light emitting element LD, first to seventh transistors T1, T2, T3, T4, T5, T6, and T7, and a storage capacitor Cst.

A first electrode (for example, an anode electrode) of the light emitting element LD may be connected to the first transistor T1 through the sixth transistor T6, and a second electrode (for example, a cathode electrode) of the light emitting element LD may be connected to the second power VSS. The light emitting element LD may emit light with a desired luminance (e.g., a predetermined luminance) corresponding to a driving current amount supplied from the first transistor T1.

One electrode of the first transistor T1 (e.g., a driving transistor) may be connected to the first power VDD through the fifth transistor T5, and another electrode of the first transistor T1 may be connected to the first electrode of the light emitting element LD through the sixth transistor T6. The first transistor T1 may control a current amount flowing from the first power VDD to the second power VSS through the light emitting element LD in response to a voltage of the first node N1 that is a gate electrode.

The second transistor T2 (e.g., a switching transistor) may be connected between the data line DL and the one electrode of the first transistor T1. In addition, a gate electrode of the second transistor T2 may be connected to a first scan line SL. The second transistor T2 may be turned on when a scan signal of a gate on voltage is supplied to the first scan line SL, to electrically connect the data line DL and the one electrode of the first transistor T1 to each other.

The third transistor T3 may be connected between the other electrode of the first transistor T1 and the first node N1. In addition, a gate electrode of the third transistor T3 may be connected to the first scan line SL. The third transistor T3 may be turned on when the scan signal of the gate on voltage is supplied to the first scan line SL, to electrically connect the other electrode of the first transistor T1 and the first node N1 to each other.

The fourth transistor T4 may be connected between the first node N1 and an initialization power Vint. In addition, a gate electrode of the fourth transistor T4 may be connected to a second scan line SL−1. The fourth transistor T4 may be turned on when the scan signal of the gate on voltage is supplied to the second scan line SL−1, to supply a voltage of the initialization power Vint to the first node N1. Here, the initialization power Vint may be set to a voltage lower than that of the data signal. The scan signal supplied to the second scan line SL−1 may have the same waveform as the scan signal supplied to the first scan line SL of a previous stage pixel.

The fifth transistor T5 may be connected between the first power VDD and the one electrode of the first transistor T1. A gate electrode of the fifth transistor T5 may be connected to an emission control line EL. The fifth transistor T5 may be turned on when an emission control signal of a gate on voltage is supplied to the emission control line EL.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when the emission control signal of the gate on voltage is supplied to the emission control line EL.

The seventh transistor T7 may be connected between the initialization power Vint and the first electrode (for example, the anode electrode) of the light emitting element LD. In addition, a gate electrode of the seventh transistor T7 may be connected to a third scan line SL+1. The seventh transistor T7 may be turned on when the scan signal of the gate on voltage is supplied to the third scan line SL+1, to supply the voltage of the initialization power Vint to the first electrode of the light emitting element LD.

FIG. 13 shows a case where the gate electrode of the seventh transistor T7 is connected to the third scan line SL+1, but the present disclosure is not necessarily limited thereto. For example, in one or more embodiments, the gate electrode of the seventh transistor T7 may be connected to the first scan line SL or the second scan line SL−1. In this case, the voltage of the initialization power Vint may be supplied to the anode electrode of the light emitting element LD through the seventh transistor T7 when the scan signal of the gate on voltage is supplied to the first scan line SL or the second scan line SL+1.

The storage capacitor Cst may be connected between the first power VDD and the first node N1. The storage capacitor Cst may store a voltage corresponding to the data signal and the threshold voltage of the first transistor T1.

In FIG. 13, all of the transistors included in the driving circuit DC, for example, the first to seventh transistors T1, T2, T3, T4, T5, T6, and T7 are P-type transistors, but are not necessarily limited thereto. For example, at least one of the first to seventh transistors T1, T2, T3, T4, T5, T6, and T7 may be changed to an N-type transistor.

Figure 14:
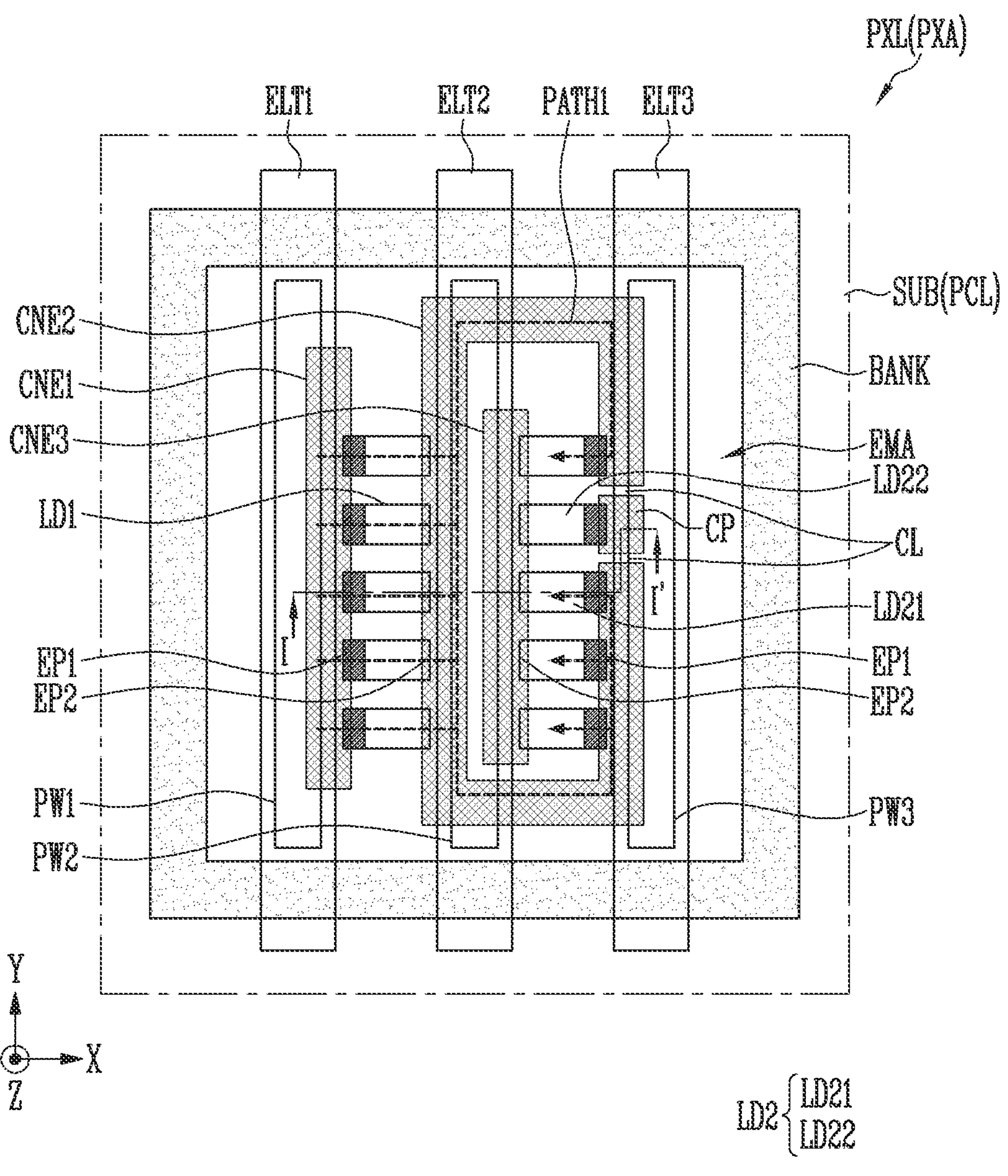
FIG. 14 is a plan view illustrating an example of the pixel of FIG. 8.

FIG. 14 is a plan view illustrating an example of the pixel of FIG. 8.

Referring to FIG. 14, the pixel PXL may be formed in a pixel area PXA defined on the substrate SUB. The pixel area PXA may include an emission area EMA. According to one or more embodiments, the pixel PXL may include a bank BANK (or a partition wall), and the emission area EMA may be defined by the bank BANK surrounding the emission area EMA.

The pixel PXL may include a first electrode ELT1, a second electrode ELT2, and a third electrode ELT3 sequentially arranged along a first direction (X-axis direction). Each of the first electrode ELT1, the second electrode ELT2, and the third electrode ELT3 may correspond to one of the first to fourth electrodes EL1 to EL4 described with reference to FIGS. 9 to 13.

Each of the first electrode ELT1, the second electrode ELT2, and the third electrode ELT3 may extend in a second direction (Y-axis direction) crossing the first direction (X-axis direction) in the pixel area PXA and may be disposed to be spaced from each other along the first direction (X-axis direction). However, the present disclosure is not necessarily limited thereto, and a shape, a mutual arrangement relationship, and/or the like of the first electrode ELT1, the second electrode ELT2, and the third electrode ELT3 may be variously changed. The first electrode ELT1 may be connected to the first transistor M1 described with reference to FIG. 9, and the second electrode ELT2 may be connected to the second power VSS (or the second power line) described with reference to FIG. 9. The first electrode ELT1, the second electrode ELT2, and the third electrode ELT3 may overlap the bank BANK, and each end of the first electrode ELT1 and the third electrode ELT3 may be adjacent to an edge of the pixel area PXA than the bank BANK. For reference, the first electrode ELT1 and the third electrode ELT3 may extend to adjacent pixel areas before the light emitting elements LD1 and LD2 are supplied, and the first electrode ELT1 and the third electrode ELT3 may be cut (or partially removed) from an outside of the bank BANK after the light emitting elements LD1 and LD2 are supplied and arranged.

According to one or more embodiments, each of the first electrode ELT1, the second electrode ELT2, and the third electrode ELT3 may have a single layer structure or a multiple layer structure. For example, the first electrode ELT1, the second electrode ELT2, and the third electrode ELT3 may have a multiple layer structure including a reflective electrode and a conductive capping layer. In addition, the reflective electrode may have a single layer structure or a multiple layer structure. For example, the reflective electrode may include at least one reflective conductive layer, and may selectively further include at least one transparent conductive layer disposed on and/or under the reflective conductive layer.

According to one or more embodiments, the pixel PXL may include a first bank pattern PW1 overlapping the first electrode ELT1, a second bank pattern PW2 overlapping the second electrode ELT2, and a third bank pattern PW3 overlapping the third electrode ELT3.

The first bank pattern PW1, the second bank pattern PW2, and the third bank pattern PW3 may be disposed to be spaced from each other in the emission area EMA, and may protrude one area of each of the first electrode ELT1, the second electrode ELT2, and the third electrode ELT3 in an upper direction, that is, a third direction (Z-axis direction). For example, the first electrode ELT1 may be disposed on the first bank pattern PW1 and may be protruded in the third direction (Z-axis direction) by the first bank pattern PW1, the second electrode ELT2 may be disposed on the second bank pattern PW2 and may be protruded in the third direction (Z-axis direction) by the second bank pattern PW2, and the third electrode ELT3 may be disposed on the third bank pattern PW3 and may be protruded in the third direction (Z-axis direction) by the third bank pattern PW3.

The pixel PXL may include the first light emitting element LD1 and the second light emitting element LD2.

The first light emitting element LD1 may be disposed between the first electrode ELT1 and the second electrode ELT2. A first end EP1 of the first light emitting element LD1 may face (e.g., oppose) the first electrode ELT1, and a second end EP2 of the first light emitting element LD1 may face (e.g., oppose) the second electrode ELT2. When a plurality of first light emitting elements LD1 are provided, the plurality of first light emitting elements LD1 may be connected in parallel to each other between the first electrode ELT1 and the second electrode ELT2, and may configure the first light emitting unit EMU1 described with reference to FIG. 9 and the like.

Similarly, the second light emitting element LD2 may be disposed between the second electrode ELT2 and the third electrode ELT3. A first end EP1 of the second light emitting element LD2 may face (or oppose) the third electrode ELT3, and a second end EP2 of the second light emitting element LD2 may face (or oppose) the second electrode ELT2. The second end EP2 of the first light emitting element LD1 and the second end EP2 of the second light emitting element LD2 may have the semiconductor layer of the same type (for example, the first semiconductor layer 11 described with reference to FIG. 2) and may face (e.g., oppose) each other with the second electrode ELT2 interposed therebetween. When a plurality of second light emitting elements LD2 are provided, the plurality of second light emitting elements may be connected to each other in parallel between the second electrode ELT2 and the third electrode ELT3, and may configure the second light emitting unit EMU2 described with reference to FIG. 9 and the like.

In FIG. 14, the light emitting elements LD1 and LD2 are aligned in the first direction (X-axis direction) between the first electrode ELT1, the second electrode ELT2, and the third electrode ELT3, but an arrangement direction of the light emitting elements LD1 and LD2 is not limited thereto. For example, at least one of the light emitting elements LD1 and LD2 may be arranged in an oblique direction.

The first light emitting element LD1 and the second light emitting element LD2 may be electrically connected between the first electrode ELT1 and the second electrode ELT2 and between the second electrode ELT2 and the third electrode ELT3. For example, the first end EP1 of the first light emitting element LD1 may be electrically connected to the first electrode ELT1, and the second end EP2 of the second light emitting element LD2 may be electrically connected to the second electrode ELT2.

In one or more embodiments, the first end EP1 of the first light emitting element LD1 may not be directly disposed on the first electrode ELT1, and may be electrically connected to the first electrode EL1 through at least one contact electrode, for example, a first contact electrode CNE1.

Similarly, the second end EP2 of the second light emitting element LD2 may not be directly disposed on the second electrode ELT2, and may be electrically connected to the second electrode ELT2 through at least one contact electrode, for example, a third contact electrode CNE3. However, the present disclosure is not necessarily limited thereto, and the first end EP1 of the first light emitting element LD1 may be in direct contact with the first electrode ELT1 and may be electrically connected to the first electrode ELT1.

According to one or more embodiments, each of the light emitting elements LD1 and LD2 may be an ultra-small light emitting diode using a material of an inorganic crystal structure, for example, as small as a nano scale to a micro scale. For example, each of the first light emitting element LD1 and the second light emitting element LD2 may be the light emitting element LD shown in any one of FIGS. 1 to 7.

According to one or more embodiments, the light emitting elements LD1 and LD2 may be prepared in a dispersed form in a suitable solution (e.g., predetermined solution) and may be supplied to the emission area EMA of the pixel area PXA through an inkjet printing method or a slit coating method. For example, the light emitting elements LD1 and LD2 may be mixed with a volatile solvent and may be supplied to the emission area EMA. At this time, when a suitable voltage (e.g., a predetermined voltage) is applied between the first electrode ELT1 and the second electrode ELT2 and between the second electrode ELT2 and the third electrode ELT3, the light emitting elements LD1 and LD2 are self-aligned between the first electrode ELT1 and the second electrode ELT2 and between the second electrode ELT2 and the third electrode ELT3 while an electric field is formed between the first electrode ELT1 and the second electrode ELT2 and between the second electrode ELT2 and the third electrode ELT3. The light emitting elements LD1 and LD2 may be stably arranged, by volatilizing or removing the solvent in another method after the light emitting elements LD1 and LD2 are aligned.

According to one or more embodiments, the pixel PXL may include the first contact electrode CNE1, a second contact electrode CNE2, the third contact electrode CNE3, and a conductive pattern CP.

The first contact electrode CNE1 may be formed on the first end EP1 of the first light emitting element LD1 and at least one area of the first electrode ELT1 corresponding thereto, to physically and/or electrically connect the first end EP1 of the first light emitting element LD1 to the first electrode ELT1.

The second contact electrode CNE2 may be formed on the second end EP2 of the first light emitting element LD1 and at least one area of the second electrode ELT2 corresponding thereto. In addition, the second contact electrode CNE2 may bypass the third contact electrode CNE3 and extend. For example, the second contact electrode CNE2 may be spaced from the third contact electrode CNE3 and may have a shape at least partially surrounding the third contact electrode CNE3. That is, the second contact electrode CNE2 may have a closed loop shape as a whole, but may have a partially cut or open shape. In this case, the second contact electrode CNE2 may be connected to the first end EP1 of the second light emitting element LD2 and the third electrode ELT3 without directly contacting the third contact electrode CNE3. That is, one side of the second contact electrode CNE2 may be in contact with the second end EP2 of the first light emitting element LD1, and another side of the second contact electrode CNE2 may be in contact with the first end EP1 of the second light emitting element LD2 and the third electrode ELT3. Accordingly, the second contact electrode CNE2 may electrically connect the second end EP2 of the first light emitting element LD1 and the first end EP1 of the second light emitting element LD2.

The second contact electrode CNE2 may be partially disconnected by a plurality of cutting lines CL. The conductive pattern CP may be positioned between the cutting lines CL. The conductive pattern CP may be a portion where the second contact electrode CNE2 is disconnected by the cutting line CL. That is, the conductive pattern CP and the second contact electrode CNE2 may be formed of the same conductive material.

One end of the conductive pattern CP may be in contact with the first end EP1 of the second light emitting element LD2, and another end of the conductive pattern CP may be in contact with the third electrode ELT3. For example, one end of the conductive pattern CP may be in contact with a first end EP1 of a second sub light emitting element LD22 of the second light emitting element LD2. Here, a first sub light emitting element LD21 of the second light emitting element LD2 may refer to a normal light emitting element, the second sub light emitting element LD22 of the second light emitting element LD2 may refer to a defective light emitting element, and the defect may include a defect of the light emitting element itself, a short defect, a defect in which the light emitting element is aligned in a reverse direction and thus a current substantially does not flow, and the like. As the conductive pattern CP is disconnected from the second contact electrode CNE2 by the cutting line CL, the conductive pattern CP connected to the first end EP1 of the second sub light emitting element LD22 may be floated. Therefore, even though the second sub light emitting element LD22, that is, a defective light emitting element exists, a lighting defect of the pixel PXL may be repaired by disconnecting the conductive pattern CP from the second contact electrode CNE2. In this case, remaining first sub light emitting elements LD21 excluding the second sub light emitting element LD22 may be electrically connected to each other through the second contact electrode CNE2 disposed in a shape surrounding at least a portion of the first sub light emitting element LD21, to receive a driving signal provided along a first path PATH1, to be normally lit. That is, the non-emission area due to the repair of the display device may be reduced or minimized.

The third contact electrode CNE3 may be formed on the second end EP2 of the second light emitting element LD2 and at least one area of the second electrode ELT2 corresponding thereto, to physically and/or electrically connect the second end EP2 of the second light emitting element LD2 to the second electrode ELT2. Therefore, the first light emitting element LD1 and the second light emitting element LD2 may be connected in series between the first electrode ELT1 and the second electrode ELT2 through the first contact electrode CNE1, the second contact electrode CNE2, and the third contact electrode CNE3.

The light emitting elements LD1 and LD2 may be gathered in the pixel area PXA to configure a light source of the corresponding pixel PXL. For example, when a driving current flows along the first path PATH1 and the like in the pixel PXL during each frame period, light of a luminance corresponding to the driving current may be emitted while the light emitting elements LD1 and LD2 connected in a forward direction between the first electrode ELT1 and the second electrode ELT2 of the pixel PXL emit light.

Figure 15:
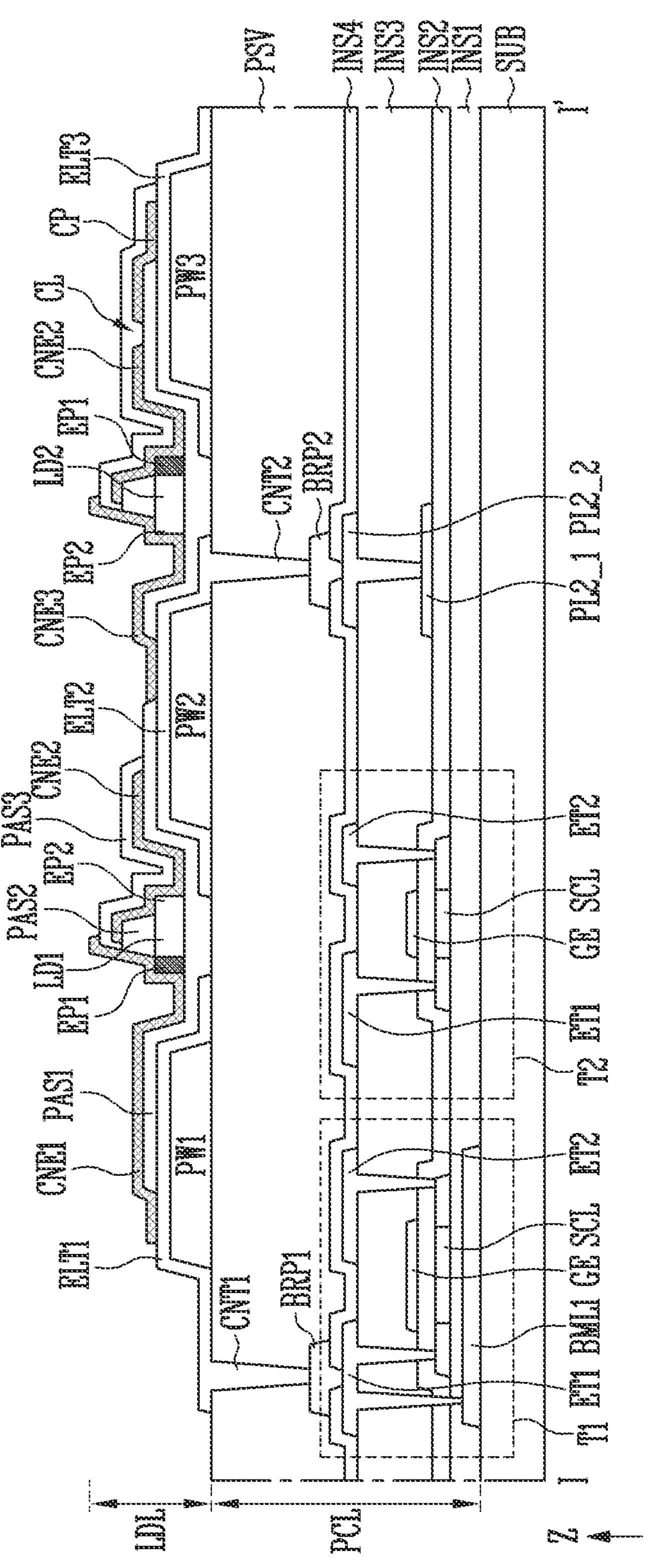
FIGS. 15 and 16 are cross-sectional views taken along the line I-I' of FIG. 14.
Figure 16:
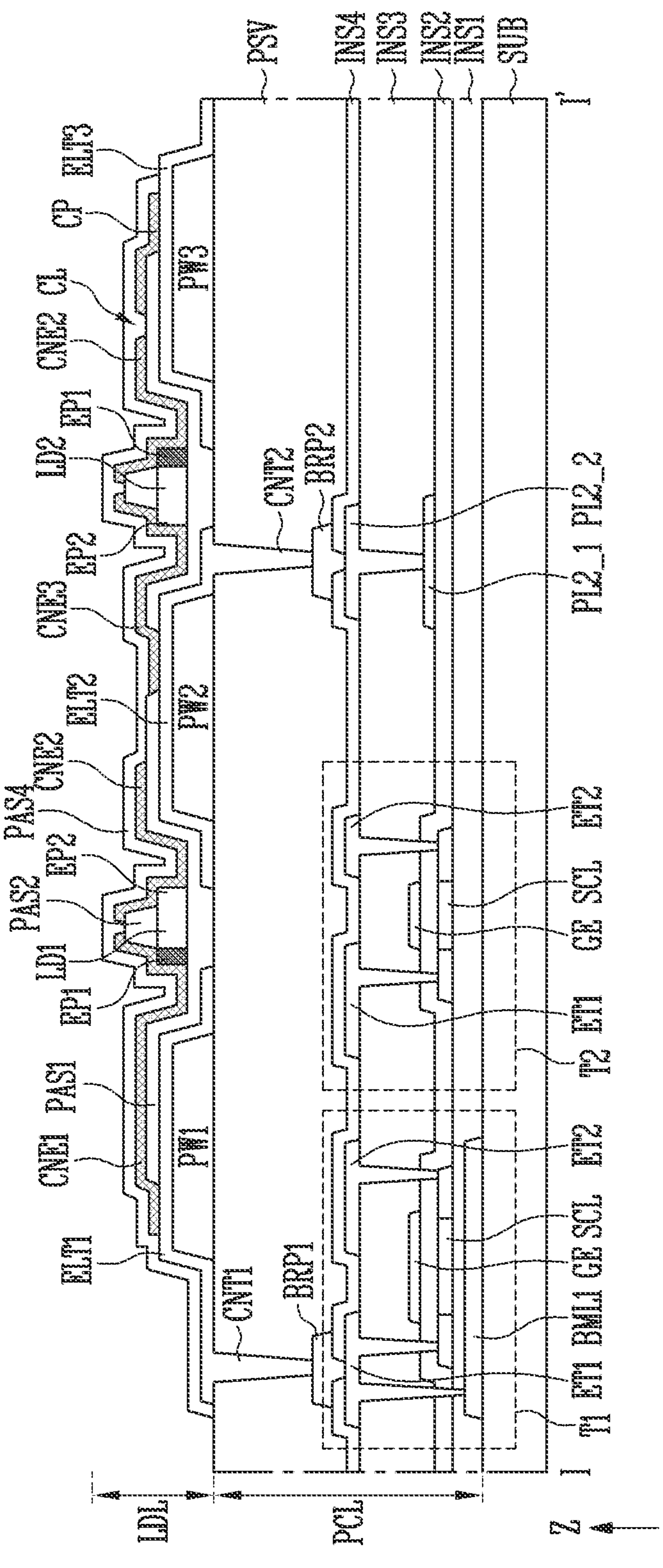

FIGS. 15 and 16 are cross-sectional views taken along the line I-I' of FIG. 14.

Referring to FIG. 15, a pixel circuit layer PCL and a light emitting element layer LDL may be sequentially disposed on the substrate SUB. According to one or more embodiments, the pixel circuit layer PCL and the light emitting element layer LDL may be entirely formed in the display area DA of the display panel PN of FIG. 8.

The pixel circuit layer PCL may include a first conductive layer, a first insulating layer INS1, a semiconductor layer, a second insulating layer INS2, a second conductive layer, a third insulating layer INS3, a third conductive layer, a fourth insulating layer INS4, a fourth conductive layer, and a protective layer PSV. As shown in FIG. 15, the first conductive layer, the first insulating layer INS1, the semiconductor layer, the second insulating layer INS2, the second conductive layer, the third insulating layer INS3, the third conductive layer, the fourth insulating layer INS4, the fourth conductive layer, and the protective layer PSV may be sequentially stacked on the substrate SUB.

The first conductive layer may be disposed on the substrate SUB and may include a back gate electrode BML1. The back gate electrode BML1 may be substantially the same as the back gate electrode described with reference to FIG. 11, and may configure a back gate electrode of the first transistor T1. Here, the first transistor T1 may be the first transistor M1 described with reference to FIGS. 9 to 12 or the first transistor T1 described with reference to FIG. 13. In one or more embodiments, the second transistor T2 may be the second transistor M2 described with reference to FIGS. 9 to 12 or the second transistor T2 described with reference to FIG. 13, and may be substantially identical to or similar to the first transistor T1 except for the back gate electrode. Therefore, the pixel circuit layer PCL is described based on the first transistor T1.

According to one or more embodiments, a buffer layer may be disposed between the first conductive layer and the substrate SUB. The buffer layer may be disposed on the entire surface of the substrate SUB. The buffer layer may prevent diffusion of an impurity ion, prevent penetration of moisture or external air, and perform a surface planarization function. The buffer layer may include silicon nitride, silicon oxide, silicon oxynitride, or the like.

The first insulating layer INS1 may be disposed on the substrate SUB and the first conductive layer. The first insulating layer INS1 may be generally disposed over the entire surface of the substrate SUB.

The first insulating layer INS1 may include an inorganic insulating material such as silicon oxide, silicon nitride, silicon oxynitride, hafnium oxide, aluminum oxide, titanium oxide, tantalum oxide, or zinc oxide, or an organic insulating material such as an acryl-based resin, an epoxy resin, a phenol resin, a polyamide-based resin, polyimide-based resin, unsaturated polyester-based resin, polyphenylene-based resin, polyphenylene sulfide-based resin, or benzocyclobutene. The first insulating layer INS1 may be a single layer or multiple layers formed of stack layers of different materials.

The semiconductor layer may be disposed on the first insulating layer INS1. The semiconductor layer may be an active layer forming a channel of the first transistor T1. The semiconductor layer may include a source area and a drain area that are in contact with a first transistor electrode ET1 (or a source electrode) and a second transistor electrode ET2 (or a drain electrode) to be described later. An area between the source area and the drain area may be a channel area.

The semiconductor layer may include a semiconductor pattern SCL. The semiconductor pattern SCL may configure a channel of the first transistor T1 (or the second transistor T2).

The semiconductor pattern SCL may include an oxide semiconductor. The channel area of the semiconductor pattern SCL may be a semiconductor pattern that is not doped with an impurity, and may be an intrinsic semiconductor. The source area and the drain area of the semiconductor pattern SCL may be a semiconductor pattern doped with an impurity. As the impurity, an n-type impurity may be used.

The second insulating layer INS2 (or a gate insulating layer) may be disposed on the semiconductor layer and the first insulating layer INS1. The second insulating layer INS2 may be generally disposed over the entire surface of the substrate SUB. The second insulating layer INS2 may be a gate insulating layer having a gate insulating function.

Similar to the first insulating layer INS1, the second insulating layer INS2 may include an inorganic insulating material such as a silicon compound or a metal oxide.

The second conductive layer may be disposed on the second insulating layer INS2. The second conductive layer may include a gate electrode GE (or a first conductive pattern) and a first sub power line PL2_1. In addition, the second conductive layer may further include lines (for example, a scan line, and a gate line) connected to a gate electrode GE of a transistor or configuring the gate electrode GE, capacitor electrodes, and the like.

The gate electrode GE may be disposed to overlap the semiconductor pattern SCL in the third direction (e.g., Z-axis direction) and may configure the gate electrode of the first transistor T1.

The second power VSS described with reference to FIG. 9 may be applied to the first sub power line PL2_1.

The second conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer may have a single layer or multiple layer structure.

The third insulating layer INS3 (or an interlayer insulating layer) may be disposed on the second conductive layer and the second insulation layer INS2, and may be disposed over the entire surface of the substrate SUB. The third insulating layer INS3 may be an interlayer insulating layer that insulates the second conductive layer and the third conductive layer.

The third insulating layer INS3 may include an inorganic insulating material such as silicon oxide, silicon nitride, silicon oxynitride, hafnium oxide, aluminum oxide, titanium oxide, tantalum oxide, or zinc oxide, or an organic insulating material such as an acryl-based resin, an epoxy resin, a phenol resin, a polyamide-based resin, polyimide-based resin, unsaturated polyester-based resin, polyphenylene-based resin, polyphenylene sulfide-based resin, or benzocyclobutene. The third insulating layer INS3 may be a single layer or multiple layers formed of stack layers of different materials.

The third conductive layer may be disposed on the third insulating layer INS3. The third conductive layer may include a first transistor electrode ET1 (or a second conductive pattern), a second transistor electrode ET2 (or a third conductive pattern), and a second sub power line PL2_2. In addition, the third conductive layer may further include lines (for example, a data line) and power lines connected to at least one of the first transistor electrode ET1 and the second transistor electrode ET2.

The first transistor electrode ET1 may overlap a partial area (for example, a source area of the first transistor T1) of the semiconductor pattern SCL, and may be connected to a partial area of the semiconductor pattern SCL exposed through a contact hole penetrating the second insulating layer INS2 and the third insulating layer INS3. The first transistor electrode ET1 may configure a first electrode (for example, a source electrode) of the first transistor T1. The first transistor electrode ET1 may be connected to the back gate electrode BML1 exposed through a contact hole penetrating first insulating layer INS1, the second insulating layer INS2, and the third insulating layer INS3

Similarly, the second transistor electrode ET2 may overlap a partial area (for example, a drain area of the first transistor T1) of the semiconductor pattern SCL, and may be connected to a partial area of the semiconductor pattern SCL exposed through a contact hole penetrating the second insulating layer INS2 and the third insulating layer INS3. The second transistor electrode ET2 may configure a second electrode (for example, a drain electrode) of the first transistor T1.

The second sub power line PL2_2 may be connected to the first sub power line PL2_1 exposed through a contact hole penetrating the third insulating layer INS3. The second sub power line PL2_2 may configure a power line for supplying the second power VSS to the pixel PXL of FIG. 9 together with the first sub power line PL2_1.

Similar to the second conductive layer, the third conductive layer may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer may have a single layer or multiple layer structure.

The fourth insulating layer INS4 may be disposed on the third conductive layer, the third insulating layer INS3 and may be generally disposed over the entire surface of the substrate SUB. The fourth insulating layer INS4 may be an interlayer insulating layer that insulates the third conductive layer and the fourth conductive layer.

Similar to the third insulating layer INS3, the fourth insulating layer INS4 may include an inorganic insulating material or an organic insulating material.

The fourth conductive layer may be disposed on the fourth insulating layer INS4. The fourth conductive layer may include a first bridge pattern BRP1 and a second bridge pattern BRP2.

The first bridge pattern BRP1 may overlap the first transistor electrode ET1 of the first transistor T1 in the third direction (e.g., the Z-axis direction) and may be connected to the first transistor electrode ET1 exposed through a contact hole penetrating the fourth insulating layer INS4. The first bridge pattern BRP1 may connect the first electrode ELT1 and the first transistor T1 to be described later.

The second bridge pattern BRP2 may overlap the second sub power line PL2_2 in the third direction (e.g., Z-axis direction) and may be connected to the second sub power line PL2_2 exposed through a contact hole penetrating the fourth insulating layer INS4. The second bridge pattern BRP2 may connect the second electrode ELT2 and the second sub power line PL2_2 to be described later.

The protective layer PSV may be disposed on the fourth conductive layer and the fourth insulating layer INS4. The protective layer PSV may be provided in a form including an organic insulating layer, an inorganic insulating layer, or an organic insulating layer disposed on an inorganic insulating layer.

A first contact hole CNT1 exposing the first bridge pattern BRP1 and a second contact hole CNT2 exposing the second bridge pattern BRP2 may be formed in the protective layer PSV.

The light emitting element layer LDL may include the first to third bank patterns PW1, PW2, and PW3, the first to third electrodes ELT1, ELT2, and ELT3, a first passivation layer PAS1 (or a fifth insulating layer), the first and second light emitting elements LD1 and LD2, a second passivation layer PAS2 (or a sixth insulating layer), the second contact electrode CNE2, a third passivation layer PAS3 (or a seventh insulating layer), and first and third contact electrodes CNE1 and CNE3 sequentially disposed and/or formed on the pixel circuit layer PCL.

The first to third bank patterns PW1, PW2, and PW3 may be disposed on the pixel circuit layer PCL (or the protective layer PSV). The first to third bank patterns PW1, PW2, and PW3 may be disposed to be spaced from each other in the emission area EMA of FIG. 14. The first to third bank patterns PW1, PW2, and PW3 may protrude in the third direction (Z-axis direction) on the pixel circuit layer PCL. According to one or more embodiments, the first to third bank patterns PW1, PW2, and PW3 may have substantially the same height, but are not necessarily limited thereto.

According to one or more embodiments, the first bank pattern PW1 may be disposed between the pixel circuit layer PCL and the first electrode ELT1. The first bank pattern PW1 may be disposed adjacent to the first end EP1 of the first light emitting element LD1. For example, one side surface of the first bank pattern PW1 may be positioned at a distance adjacent to the first end EP1 of the first light emitting element LD1, and may be disposed to face (e.g., oppose) the first end EP1 of the first light emitting element LD1.

According to one or more embodiments, the second bank pattern PW2 may be disposed between the pixel circuit layer PCL and the second electrode ELT2. The second bank pattern PW2 may be disposed adjacent to the second end EP2 of the first light emitting element LD1. For example, one side surface of the second bank pattern PW2 may be positioned at a distance adjacent to the second end EP2 of the first light emitting element LD1 and may be disposed to face (e.g., oppose) the second end EP2 of the first light emitting element LD1. In addition, the second bank pattern PW2 may be disposed adjacent to the second end EP2 of the second light emitting element LD2. For example, another side surface of the second bank pattern PW2 may be positioned at a distance adjacent to the second end EP2 of the second light emitting element LD2 and may be disposed to face (e.g., oppose) the second end EP2 of the second light emitting element LD2.

According to one or more embodiments, the third bank pattern PW3 may be disposed between the pixel circuit layer PCL and the third electrode ELT3. The third bank pattern PW3 may be disposed adjacent to the first end EP1 of the second light emitting element LD2. For example, one side surface of the third bank pattern PW3 may be positioned at a distance adjacent to the first end EP1 of the second light emitting element LD2, and may be disposed to face (e.g., oppose) the first end EP1 of the second light emitting element LD2.

The first to third bank patterns PW1, PW2, and PW3 may include an insulating material including an inorganic material and/or an organic material. For example, the first to third bank patterns PW1, PW2, and PW3 may include an inorganic layer of at least one layer including various currently known inorganic insulating materials including silicon nitride (SiNx) or silicon oxide (SiOx). Alternatively, the first to third bank patterns PW1, PW2, and PW3 may include an organic layer, a photoresist layer, and/or the like of at least one layer of including various currently known organic insulating materials, or may be configured of an insulator of a single layer or multiple layers including organic/inorganic materials in combination. That is, a configuration material of the first to third bank patterns PW1, PW2, and PW3 may be variously changed.

In one or more embodiments, the first to third bank patterns PW1, PW2, and PW3 may function as a reflective member. For example, the first to third bank patterns PW1, PW2, and PW3 may function as a reflective member for improving light emitting efficiency of the pixel PXL by guiding light emitted from the light emitting element LD in a desired direction together with the first to third electrodes ELT1, ELT2, and ELT3 provided on the first to third bank patterns PW1, PW2, and PW3.

The first to third electrodes ELT1, ELT2, and ELT3 may be disposed on the first to third bank patterns PW1, PW2, and PW3, respectively. The first to third electrodes ELT1, ELT2, and ELT3 may be disposed to be spaced from each other in the emission area EMA of FIG. 14.

Each of the first to third electrodes ELT1, ELT2, and ELT3 may include at least one conductive material. For example, each of the first to third electrodes ELT1, ELT2, and ELT3 may include at least one material from among a metal such as Ag, Mg, Al, Pt, Pd, Au, Ni, Nd, Ir, Cr, Ti, and an alloy thereof, a conductive oxide such as ITO, IZO, ZnO, and ITZO, and a conductive polymer such as PEDOT, but is not limited thereto.

In addition, each of the first to third electrodes ELT1, ELT2, and ELT3 may be configured as a single layer or multiple layers. For example, each of the first to third electrodes ELT1, ELT2, and ELT3 may include a reflective electrode layer of at least one layer. In addition, each of the first to third electrodes ELT1, ELT2, and ELT3 may selectively further include at least one of a transparent electrode layer of at least one layer disposed on and/or under the reflective electrode layer, and a conductive capping layer of at least one layer covering the reflective electrode layer and/or the transparent electrode layer.

According to one or more embodiments, the reflective electrode layer of each of the first to third electrodes ELT1, ELT2, and ELT3 may be formed of a conductive material having a uniform reflectivity. For example, the reflective electrode layer may include at least one of metals such as Ag, Mg, Al, Pt, Pd, Au, Ni, Nd, Ir, Cr, and an alloy thereof, but is not limited thereto. That is, the reflective electrode layer may be formed of various reflective conductive materials. When each of the first to third electrodes ELT1, ELT2, and ELT3 includes the reflective electrode layer, light emitted from both ends of each of the first and second light emitting elements LD1 and LD2, that is, the first and second ends EP1 and EP2 may be caused to proceed in a direction in which an image is displayed (for example, a front direction, such as, Z-axis direction). In particular, when the first to third electrodes ELT1, ELT2, and ELT3 are disposed to face (e.g., oppose) the first and second ends EP1 and EP2 of each of the light emitting elements LD1 and LD2 while having an inclined surface or a curved surface corresponding to a shape of the first to third bank patterns PW1, PW2, and PW3, the light emitted from the first and second ends EP1 and EP2 of each of the light emitting elements LD1 and LD2 may be reflected by the first to third electrodes ELT1, ELT2, and ELT3 and may further proceed in the front direction of the display panel PNL, that is, in the third direction (Z-axis direction). Accordingly, efficiency of the light emitted from the light emitting elements LD may be improved.

The first passivation layer PAS1 may be disposed on one area of the first to third electrodes ELT1, ELT2, and ELT3. For example, the first passivation layer PAS1 may be formed to cover one area of the first to third electrodes ELT1, ELT2, and ELT3, and may include an opening exposing another area of the first to third electrodes ELT1, ELT2, and ELT3.

In one or more embodiments, the first passivation layer PAS1 may be formed to primarily cover the first to third electrodes ELT1, ELT2, and ELT3 entirely. After the light emitting elements LD are supplied and aligned on the first passivation layer PAS1, the first passivation layer PAS1 may be partially opened to expose the first to third electrodes ELT1, ELT2, and ELT3 in suitable first, second, and third contact portions (e.g., predetermined first, second, and third contact portions) as shown in FIG. 15. Alternatively, the first passivation layer PAS1 may be patterned in a form of an individual pattern locally disposed under the light emitting elements LD after the supply and the alignment of the light emitting elements LD are completed.

That is, the first passivation layer PAS1 may be interposed between the first and second electrodes ELT1 and ELT2 and the first light emitting element LD1 and between the second and third electrodes ELT2 and ELT3 and the second light emitting element LD2, and may expose at least one area of each of the first to third electrodes ELT1, ELT2, and ELT3. The first passivation layer PAS1 may be formed to cover the first to third electrodes ELT1, ELT2, and ELT3 after the first to third electrodes ELT1, ELT2, and ELT3 are formed, to prevent the first to third electrodes ELT1, ELT2, and ELT3 from being damaged or a metal from being deposited in a subsequent process. In addition, the first passivation layer PAS1 may stably support the light emitting elements LD1 and LD2. According to one or more embodiments, the first passivation layer PAS1 may be omitted.

The light emitting elements LD1 and LD2 may be supplied and aligned in the emission area EMA of FIG. 14 in which the first passivation layer PAS1 is formed. For example, the light emitting elements LD1 and LD2 may be supplied to the emission area EMA through an inkjet method or the like, and the light emitting elements LD1 and LD2 may be aligned between the first and second electrodes ELT1 and ELT2 and between the second and third electrodes ELT2 and ELT3 by a suitable alignment voltage (e.g., a predetermined alignment voltage or an alignment signal) applied to the first to third electrodes ELT1, ELT2, and ELT3.

The second passivation layer PAS2 may be disposed on the light emitting elements LD1 and LD2, in particular, on each of the first light emitting element LD1 aligned between the first and second electrodes ELT1 and ELT2 and the second light emitting element LD2 aligned between the second and third electrodes ELT2 and ELT3, and may expose the first and second ends EP1 and EP2 of each of the light emitting elements LD1 and LD2. For example, the second passivation layer PAS2 may not cover the first and second ends EP1 and EP2 of each of the light emitting elements LD1 and LD2, and may be partially disposed only on one area of the first light emitting element LD1 and the second light emitting element LD2. The second passivation layer PAS2 may be formed in an independent pattern, but is not limited thereto. In addition, when a separation space exists between the first passivation layer PAS1 and the light emitting elements LD1 and LD2 before formation of the second passivation layer PAS2, the separation space may be filled with the second passivation layer PAS2. Accordingly, the light emitting elements LD1 and LD2 may be more stably supported.

The second contact electrode CNE2 may be disposed on the second and third electrodes ELT2 and ELT3, the second end EP2 of the first light emitting element LD1, and the first end EP1 of the second light emitting element LD2. The second contact electrode CNE2 may electrically connect the second end EP2 of the light emitting element LD1 and the first end EP1 of the second light emitting element LD2.

The second contact electrode CNE2 may be disposed on the second electrode ELT2, and may be insulated from the second electrode ELT2 by the first passivation layer PAS1. In addition, the second contact electrode CNE2 may be disposed on the second end EP2 of the first light emitting element LD1 to be in contact with the second end EP2 of the first light emitting element LD1 adjacent to the second electrode ELT2. Furthermore, the second contact electrode CNE2 may be disposed on the third electrode ELT3 to be in contact with the third electrode ELT3. For example, in one or more embodiments, the second contact electrode CNE2 may be disposed to be in contact with the third electrode ELT3 on one area of the third electrode ELT3 that is not covered by the first passivation layer PAS1. In addition, the second contact electrode CNE2 may be disposed on the first end EP1 of the second light emitting element LD2 to be in contact with the first end EP1 of the second light emitting element LD2 adjacent to the third electrode ELT3.

The second contact electrode CNE2 may be partially disconnected by a plurality of cutting lines CL. The cutting line CL may pass through the second contact electrode CNE2 to partially expose an upper surface of the first passivation layer PAS1 disposed under the second contact electrode CNE2. Because the conductive pattern CP connected to the first end EP1 of the second sub light emitting element LD22 of FIG. 14 may be floated by the cutting line CL, the lighting defect of the pixel PXL may be repaired as described above.

The third passivation layer PAS3 may be disposed on the second contact electrode CNE2 and the conductive pattern CP. The third passivation layer PAS3 may cover the second contact electrode CNE2 and the conductive pattern CP. The third passivation layer PAS3 may partially contact the upper surface of the first passivation layer PAS1 exposed by the above-described cutting line CL.

The first contact electrode CNE1 and the third contact electrode CNE3 may be disposed on the first electrode ELT1, the second electrode ELT2, the first end EP1 of the first light emitting element LD1, and the second end EP2 of the second light emitting element LD2. The first contact electrode CNE1 and the third contact electrode CNE3 may be disposed on (or at) the same layer as shown in FIG. 15. In this case, the first contact electrode CNE1 and the third contact electrode CNE3 may be formed in the same process using the same conductive material, but are not limited thereto.

The first contact electrode CNE1 may electrically connect the first end EP1 of the first light emitting element LD1 and the first electrode ELT1. The third contact electrode CNE3 may electrically connect the second end EP2 of the second light emitting element LD2 and the second electrode ELT2.

For example, the first contact electrode CNE1 may be disposed on the first electrode ELT1 to be in contact with the first electrode ELT1. For example, the first contact electrode CNE1 may be disposed to be in contact with the first electrode ELT1 on one area of the first electrode ELT1 that is not covered by the first passivation layer PAS1. In addition, the first contact electrode CNE1 may be disposed on the first end EP1 of the first light emitting element LD1 to be in contact with the first end EP1 of the first light emitting element LD1 adjacent to the first electrode ELT1. That is, the first contact electrode CNE1 may be disposed to cover the first end EP1 of the first light emitting element LD1 and at least one area of the first electrode ELT1 corresponding thereto.

Similarly, the third contact electrode CNE3 may be disposed on the second electrode ELT2 to be in contact with the second electrode ELT2. For example, the third contact electrode CNE3 may be disposed to be in contact with the second electrode ELT2 on one area of the second electrode ELT2 that is not covered by the first passivation layer PAS1. In addition, the third contact electrode CNE3 may be disposed on the second end EP2 of the second light emitting element LD2 to be in contact with the second end EP2 of the second light emitting element LD2 adjacent to the second electrode ELT2. That is, the third contact electrode CNE3 may be disposed to cover the second end EP2 of the second light emitting element LD2 and at least one area of the second electrode ELT2 corresponding thereto.

According to one or more embodiments, each of the first to third passivation layers PAS1, PAS2, and PAS3 may be configured as a single layer or multiple layers, and may include at least one inorganic insulating material and/or organic insulating material.

In FIG. 15, the first contact electrode CNE1 (or the third contact electrode CNE3) and the second contact electrode CNE2 are disposed on different layers with the third passivation layer PAS3 interposed therebetween, but the first to third contact electrodes CNE1, CNE2, and CNE3 are not limited thereto.

In addition, the first and second contact electrodes CNE1 and CNE2 (or the second and third contact electrodes CNE2 and CNE3) overlap each other, but are not limited thereto. For example, the first and second contact electrodes CNE1 and CNE2 (or the second and third contact electrodes CNE2 and CNE3) may not overlap each other.

According to one or more embodiments, the first and second contact electrodes CNE1 and CNE2 (or the first to third contact electrodes CNE1, CNE2, and CNE3) may be disposed on (or at) the same layer. Referring to FIG. 16, the first to third contact electrodes CNE1, CNE2, and CNE3 may be disposed on the first passivation layer PAS1 (and the second passivation layer PAS2). Because a disposition relationship (or overlapping relationship) between the first to third contact electrodes CNE1, CNE2, and CNE3, the first to third electrodes ELT1, ELT2, and ELT3, and the light emitting elements LD1 and LD2 is substantially identical to or similar to the disposition relationship described with reference to FIG. 15, a repetitive description is omitted.

The first contact electrode CNE1 and the second contact electrode CNE2 may be disposed to be spaced from each other on the first light emitting element LD1, and the second contact electrode CNE2 and the third contact electrode CNE3 may be disposed to be spaced from each other on the second light emitting element LD2. The first contact electrode CNE1 and the second contact electrode CNE2 may not overlap each other, and the second contact electrode CNE2 and the third contact electrode CNE3 may not overlap each other.

A fourth passivation layer PAS4 may be formed and/or disposed on one surface of the substrate SUB on which the first to third electrodes ELT1, ELT2, and ELT3, the light emitting elements LD1 and LD2, and the first to third contact electrodes CNE1, CNE2, and CNE3 are formed, so as to cover the first to third electrodes ELT1, ELT2, and ELT3, the light emitting elements LD1 and LD2, and the first to third contact electrodes CNE1, CNE2, and CNE3. The fourth passivation layer PAS4 may include a thin film encapsulation layer including an inorganic layer and/or an organic layer of at least one layer, but is not limited thereto. In addition, according to one or more embodiments, an overcoat layer (for example, a layer for planarizing an upper surface of the light emitting element layer LDL) of at least one layer may be further disposed on the fourth passivation layer PAS4.

In accordance with the display device according to one or more embodiments described above, as the conductive pattern CP is disconnected from the second contact electrode CNE2 by the cutting line CL, the conductive pattern CP connected to the first end EP1 may be floated. Therefore, even though the second sub light emitting element LD22, that is, a defective light emitting element, exists in the pixel PXL, the lighting defect of the pixel PXL may be repaired by disconnecting the conductive pattern CP from the second contact electrode CNE2. In this case, the remaining first sub light emitting elements LD21 excluding the second sub light emitting element LD22 may be electrically connected to each other through the second contact electrode CNE2 disposed in a shape surrounding at least a portion of the first sub light emitting element LD21, to receive the driving signal provided along the first path PATH1, to be normally lit. That is, the non-emission area due to the repair of the display device may be reduced or minimized.

Hereinafter, a display device according to one or more embodiments of the present disclosure is described. In the following embodiment, the same configurations as that already described is referred to by the same reference numeral, and a repetitive description is omitted or simplified.

Figure 17:
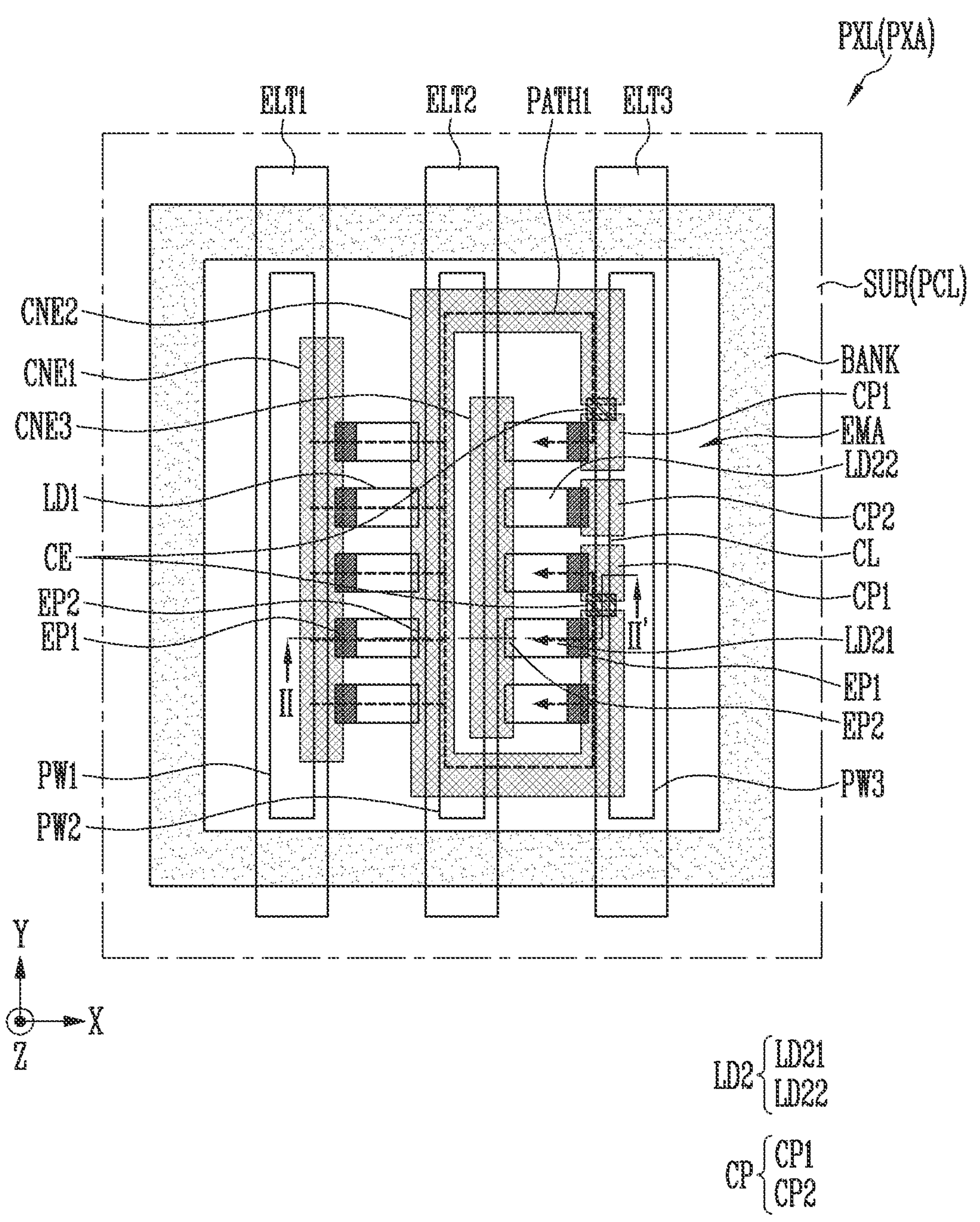
FIG. 17 is a plan view illustrating a pixel according to one or more embodiments.
Figure 18:
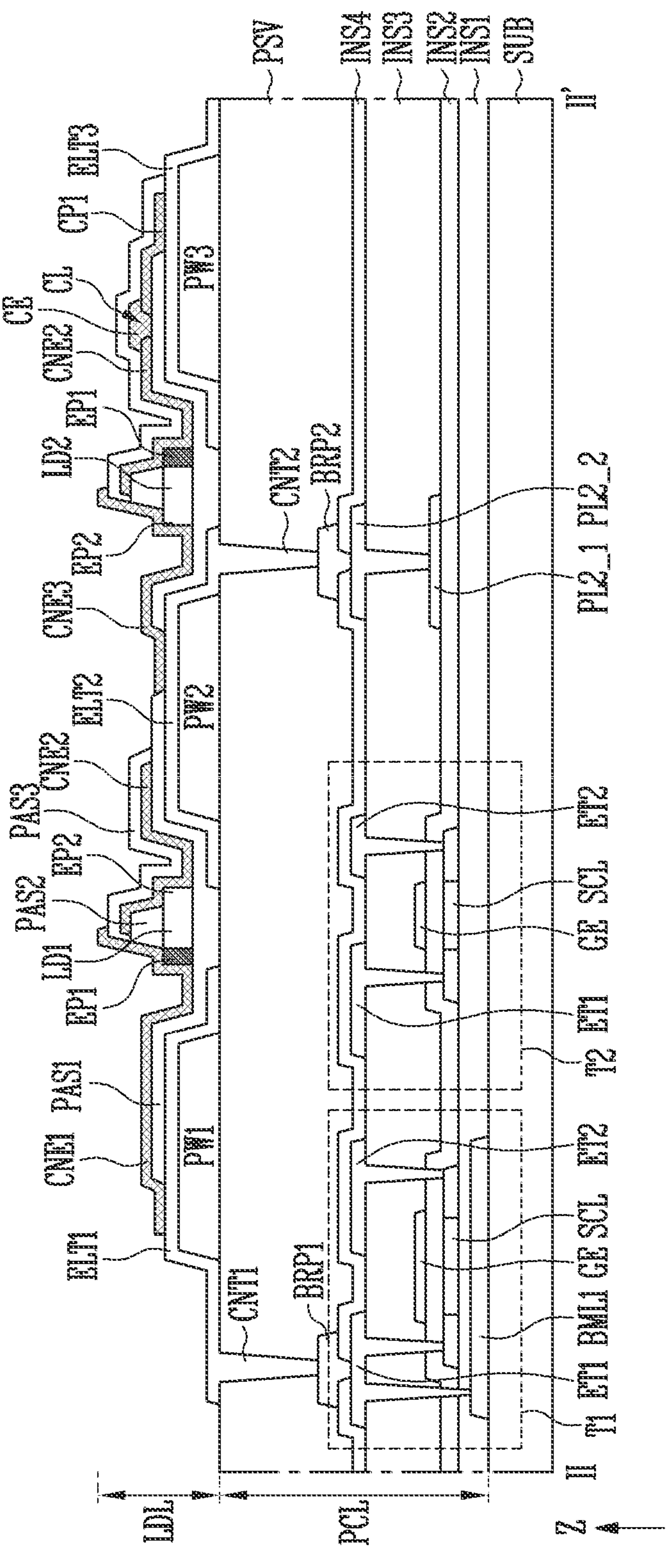
FIG. 18 is a cross-sectional view taken along the line II-II' of FIG. 17.

FIG. 17 is a plan view illustrating a pixel according to one or more embodiments. FIG. 18 is a cross-sectional view taken along the line II-II' of FIG. 17.

Referring to FIGS. 17 and 18, the pixel PXL according to the present embodiment is different from the embodiment of FIGS. 14 to 16, in that the pixel PXL according to the present embodiment further includes a connection electrode CE electrically connecting the conductive pattern CP and the second contact electrode CNE2.

Specifically, the second contact electrode CNE2 may be partially disconnected by the plurality of cutting lines CL. The conductive pattern CP may be positioned between the cutting lines CL. The conductive pattern CP may be a portion where the second contact electrode CNE2 is disconnected by the cutting line CL.

The conductive pattern CP may include a first conductive pattern CP1 and a second conductive pattern CP2 electrically separated from each other. The first conductive pattern CP1 and the second conductive pattern CP2 may be spaced from each other by the cutting line CL and may be electrically separated from each other. One end of the first conductive pattern CP1 may be in contact with the first end EP1 of the first sub light emitting element LD21 of the second light emitting element LD2, and another end of the first conductive pattern CP1 may be in contact with the third electrode ELT3. One end of the second conductive pattern CP2 may be in contact with the first end EP1 of the second sub light emitting element LD22 of the second light emitting element LD2, and another end of the second conductive pattern CP2 may be in contact with the third electrode ELT3. The second conductive pattern CP2 connected to the second sub light emitting element LD22, that is, the defective light emitting element may be disconnected from the second contact electrode CNE2 and the first conductive pattern CP1 by the cutting line CL. Accordingly, because the second conductive pattern CP2 may be floated, the lighting defect of the pixel PXL may be repaired even though a defective light emitting element exists as described above.

The connection electrode CE may be disposed on the first conductive pattern CP1 and the second contact electrode CNE2. One end of the connection electrode CE may be connected to one end of the first conductive pattern CP1 disconnected by the cutting line CL, and another end of the connection electrode CE may be connected to one end of the second contact electrode CNE2. Accordingly, the first conductive pattern CP1 disconnected by the cutting line CL and the second contact electrode CNE2 may be electrically connected to each other by the connection electrode CE. In this case, even though the first conductive pattern CP1 connected to the first sub light emitting element LD21 is disconnected by the cutting line CL during the repair process, the first sub light emitting element LD21, that is, the normal light emitting element may be electrically connected to the first electrode ELT1 and the second electrode ELT2 by the connection electrode CE. That is, because the first sub light emitting elements LD21 may be normally lit by receiving the driving signal provided along the first path PATH1, the non-emission area due to the repair may be reduced or minimized as described above.

Figure 19:
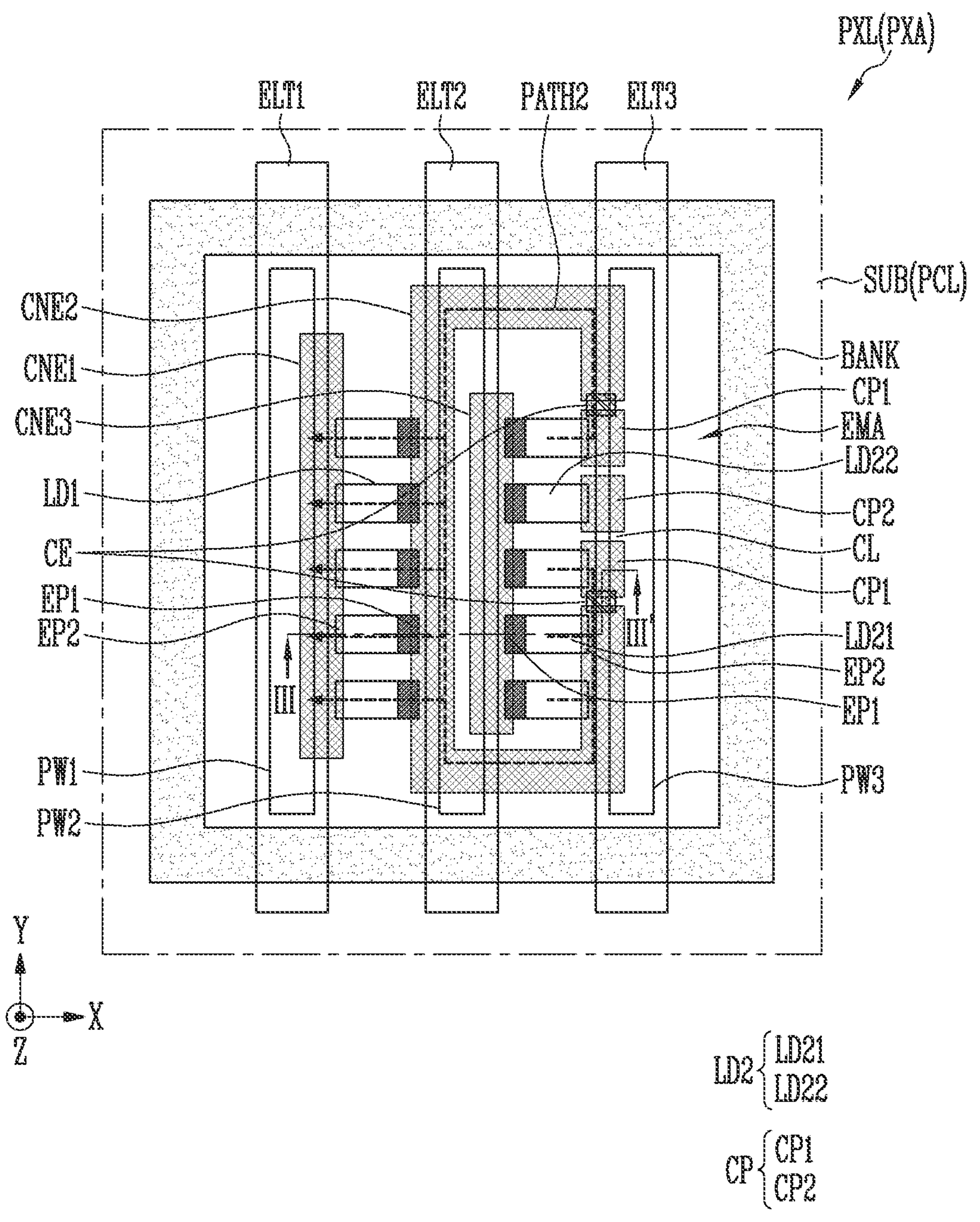
FIG. 19 is a plan view illustrating a pixel according to one or more embodiments.

FIG. 19 is a plan view illustrating a pixel according to one or more embodiments.

Referring to FIG. 19, in the pixel PXL according to the present embodiment, an arrangement direction of the first and second light emitting elements LD1 and LD2 is different from that of the embodiment of FIGS. 17 and 18.

Each of the first electrode ELT1, the second electrode ELT2, and the third electrode ELT3 may extend in the second direction (Y-axis direction) in the pixel area PXA, and may be disposed to be spaced from each other in the first direction (X-axis direction). The first electrode ELT1 may be connected to the second power VSS (or the second power line) described with reference to FIG. 9, and the second electrode ELT2 may be connected to the first transistor M1 described with reference to FIG. 9 and the like.

In order to arrange the light emitting elements LD1 and LD2, an AC voltage may be applied to the first electrode ELT1 and the third electrode ELT3 and a reference voltage (for example, ground) may be applied to the second electrode ELT2. Accordingly, the first light emitting elements LD1 may be arranged so that the first end EP1 of the first light emitting element LD1 faces (or opposes) the second electrode ELT2 and the second end EP2 of the first light emitting element LD1 faces (or opposes) the first electrode ELT1. Similarly, the second light emitting elements LD2 may be arranged so that the first end EP1 of the second light emitting element LD2 faces (or opposes) the second electrode ELT2 and the second end EP2 of the second light emitting element LD2 faces (or opposes) the third electrode ELT3.

The first contact electrode CNE1 may be formed on the second end EP2 of the first light emitting element LD1 and at least one area of the first electrode ELT1 corresponding thereto, to physically and/or electrically connect the second end EP2 of the first light emitting element LD1 to the first electrode ELT1.

The second contact electrode CNE2 may be formed on the first end EP1 of the first light emitting element LD1 and at least one area of the second electrode ELT2 corresponding thereto. In addition, the second contact electrode CNE2 may bypass the third contact electrode CNE3 or the second light emitting element LD2 and extend, and may be formed on the second end EP2 of the second light emitting element LD2 and at least one area of the third electrode ELT3 corresponding thereto. The second contact electrode CNE2 may electrically connect the first end EP1 of the first light emitting element LD1 and the second end EP2 of the second light emitting element LD2.

The third contact electrode CNE3 may be formed on the first end EP1 of the second light emitting element LD2 and at least one area of the second electrode ELT2 corresponding thereto, to physically and/or electrically connect the first end EP1 of the second light emitting element LD2 to the second electrode ELT2.

The second contact electrode CNE2 may be partially disconnected by the cutting line CL as described above. The first conductive pattern CP1 and the second conductive pattern CP2 may be spaced from each other by the cutting line CL and may be electrically separated from each other. One end of the first conductive pattern CP1 may be in contact with the second end EP2 of the first sub light emitting element LD21 of the second light emitting element LD2, and another end of the first conductive pattern CP1 may be in contact with the third electrode ELT3. One end of the second conductive pattern CP2 may be in contact with the second end EP2 of the second sub light emitting element LD22 of the second light emitting element LD2, and another end of the second conductive pattern CP2 may be in contact with the third electrode ELT3. The second conductive pattern CP2 connected to the second sub light emitting element LD22, that is, the defective light emitting element may be disconnected from the second contact electrode CNE2 and the first conductive pattern CP1 by the cutting line CL. Accordingly, because the second conductive pattern CP2 may be floated, the lighting defect of the pixel PXL may be repaired even though a defective light emitting element exists as described above.

In addition, the first conductive pattern CP1 disconnected by the cutting line CL and the second contact electrode CNE2 may be electrically connected to each other by the connection electrode CE. In this case, the first sub light emitting element LD21, that is, the normal light emitting element may be electrically connected to the first electrode ELT1 and the second electrode ELT2 by the connection electrode CE. That is, because the first sub light emitting elements LD21 may be normally lit by receiving the driving signal provided along a second path PATH2, the non-emission area due to the repair may be reduced or minimized as described above.

Figure 20:
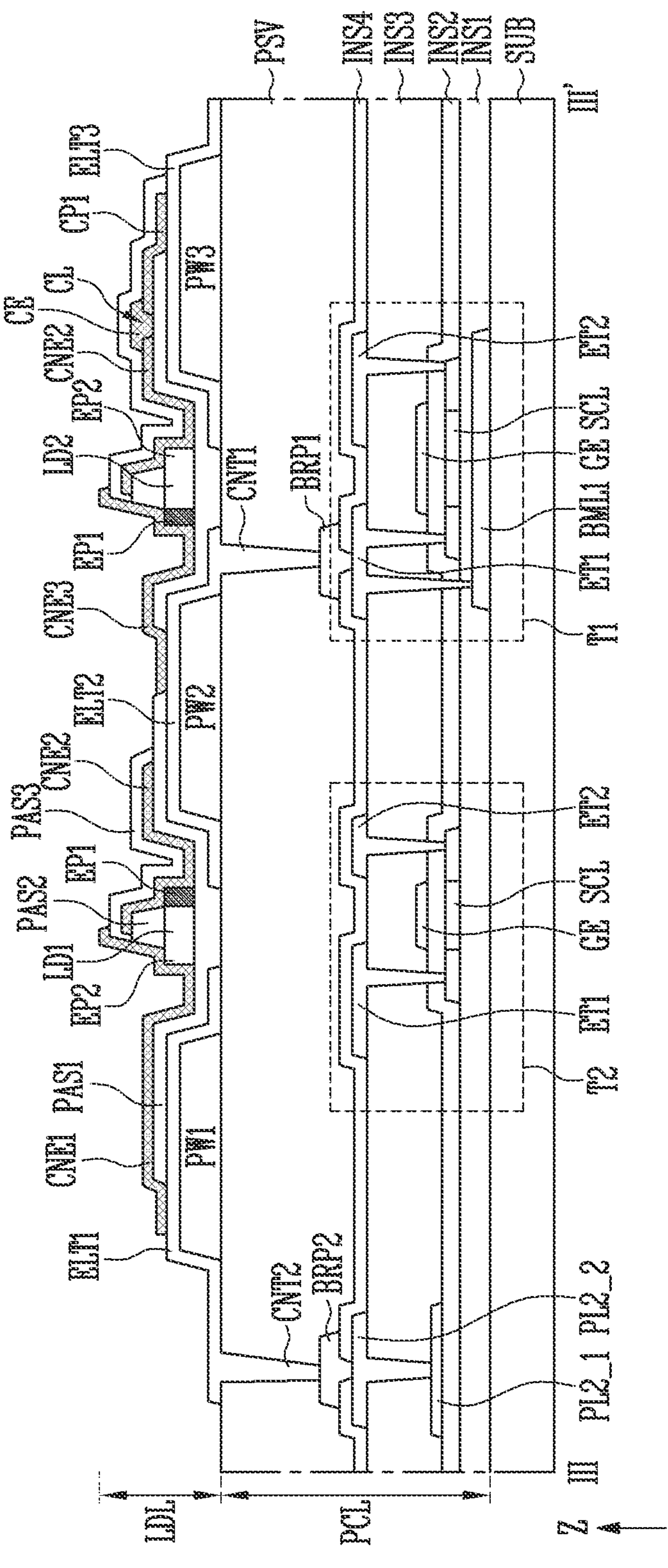
FIG. 20 is a cross-sectional view taken along the line III-III' of FIG. 19.

FIG. 20 is a cross-sectional view taken along the line III-III' of FIG. 19.

Referring to FIG. 20, first and second sub power lines PL2_1 and PL2_2 may overlap the first electrode ELT1 in the third direction (e.g., the Z-axis direction) and may be connected to the first electrode ELT1 through the second contact hole CNT2. In addition, the first transistor T1 may be disposed to overlap the second electrode ELT2 and may be connected to the second electrode ELT2 through the first contact hole CNT1.

In FIG. 20, the first contact electrode CNE1 (or the third contact electrode CNE3) and the second contact electrode CNE2 are disposed on different layers with the third passivation layer PAS3 interposed therebetween, but the first to third contact electrodes CNE1, CNE2, and CNE3 are not limited thereto. For example, the first and second contact electrodes CNE1 and CNE2 (or the first to third contact electrodes CNE1, CNE2, and CNE3) may be disposed on (or at) the same layer.

Figure 21:
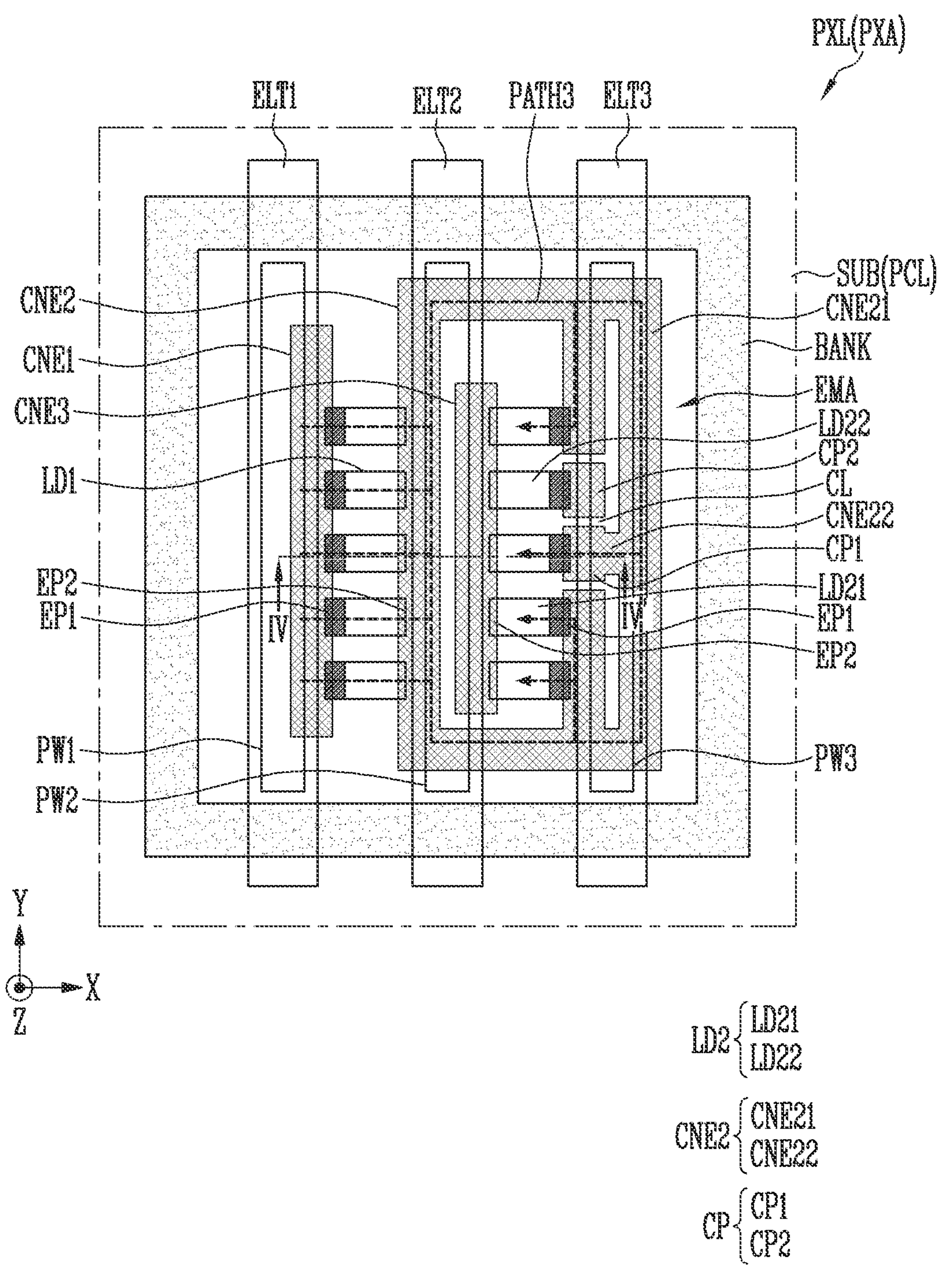
FIG. 21 is a plan view illustrating a pixel according to one or more embodiments.
Figure 22:
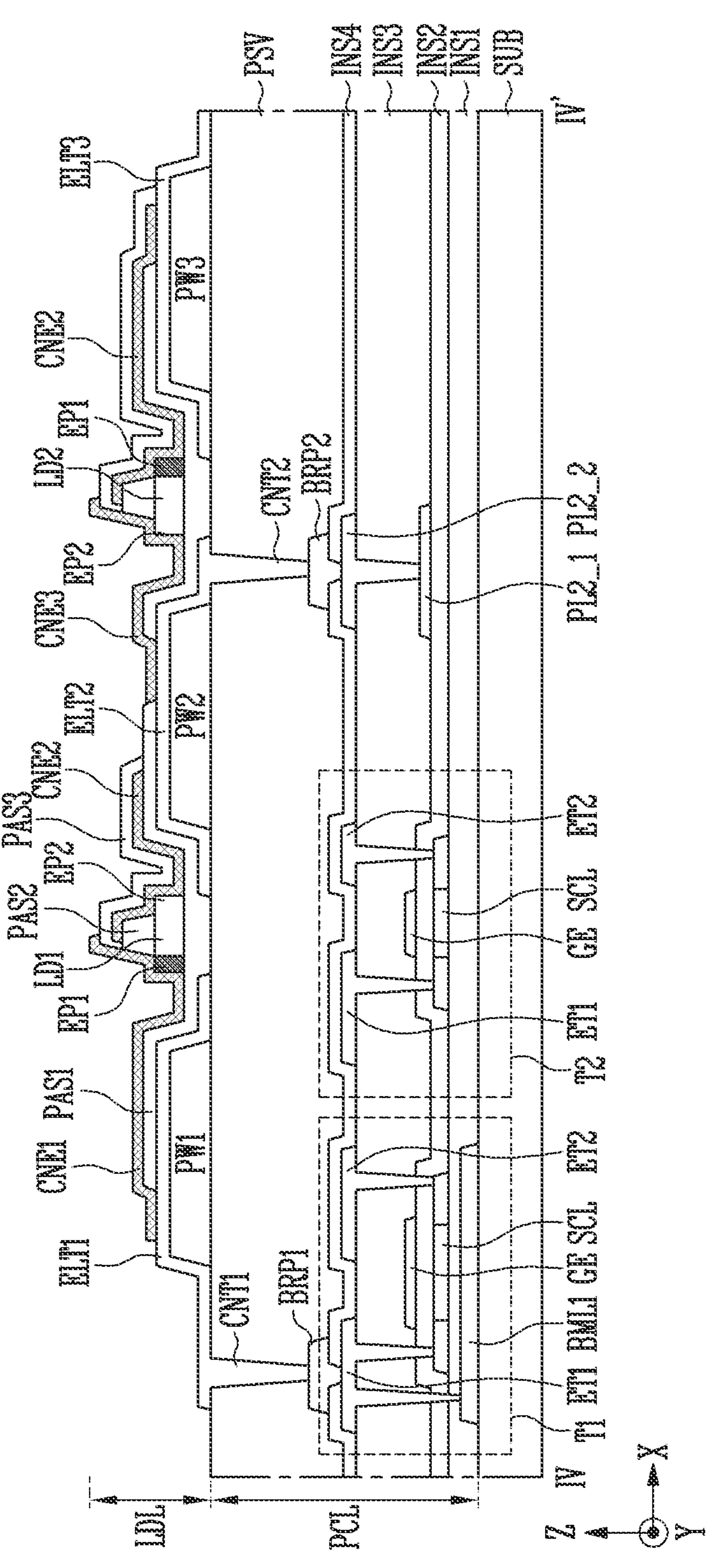
FIG. 22 is a cross-sectional view taken along the line IV-IV' of FIG. 21.

FIG. 21 is a plan view illustrating a pixel according to one or more embodiments. FIG. 22 is a cross-sectional view taken along the line IV-IV' of FIG. 21.

Referring to FIGS. 21 and 22, the pixel PXL according to the present embodiment is different from the embodiment of FIGS. 14 to 16, in that the second contact electrode CNE2 includes a plurality of first areas CNE21 spaced from each other and at least one second area CNE22 disposed between the first areas CNE21.

Specifically, the second contact electrode CNE2 may include at least two first areas CNE21 spaced from each other. The first areas CNE21 may extend along the second direction (Y-axis direction) and may be disposed to be spaced from each other in the first direction (X-axis direction). In the drawing, a case in which the second contact electrode CNE2 has at least two first areas CNE21 disposed on a side of the first end EP1 of the second light emitting element LD2 is exemplified, but the number of the first areas CNE21 is not limited thereto.

The first area CNE21 may be partially disconnected by the plurality of cutting lines CL. The conductive pattern CP may be positioned between the cutting lines CL. The conductive pattern CP may be a portion in which the first area CNE21 is disconnected by the cutting line CL. That is, the conductive pattern CP and the first area CNE21 may be formed of the same conductive material. The conductive pattern CP may include a first conductive pattern CP1 and a second conductive pattern CP2 electrically separated from each other. The first conductive pattern CP1 and the second conductive pattern CP2 may be spaced from each other by the cutting line CL and may be electrically separated from each other. One end of the first conductive pattern CP1 may be in contact with the first end EP1 of the first sub light emitting element LD21 of the second light emitting element LD2, and another end of the first conductive pattern CP1 may be in contact with the second area CNE22. One end of the second conductive pattern CP2 may be in contact with the first end EP1 of the second sub light emitting element LD22 of the second light emitting element LD2, and another end of the second conductive pattern CP2 may be in contact with the third electrode ELT3. As the second conductive pattern CP2 is disconnected from the first area CNE21 and the first conductive pattern CP1 by the cutting line CL, the second conductive pattern CP2 connected to the first end EP1 of the second sub light emitting element LD22 may be floated. Therefore, even though the second sub light emitting element LD22, that is, a defective light emitting element exists, the lighting defect of the pixel PXL may be repaired by disconnecting the second conductive pattern CP2.

The second area CNE22 may be disposed between the first areas CNE21 and the first conductive pattern CP1 that are spaced from each other. The first areas CNE21 spaced from each other may be electrically connected by the second areas CNE22. One end of the second area CNE22 may be connected to one of the first areas CNE21, and another end of the second area CNE22 may be connected to the first conductive pattern CP1.

In addition, the second area CNE22 may be disposed between the first area CNE21 and the conductive pattern CP. For example, as shown in FIG. 21, the second area CNE22 may be disposed between the first area CNE21 and the first conductive pattern CP1. The first area CNE21 and the first conductive pattern CP1 that are spaced from each other may be electrically connected to each other by the second area CNE22. One end of the second area CNE22 may be connected to the first area CNE21, and another end of the second area CNE22 may be connected to the first conductive pattern CP1. Accordingly, even though the first conductive pattern CP1 is disconnected from a portion of the first area CNE21 during the repair process, the first conductive pattern CP1 may be electrically connected to a remaining portion of the first area CNE21 by the second area CNE22. That is, the first sub light emitting element LD21 may be electrically connected to the first electrode ELT1 and the second electrode ELT2 by the second area CNE22. That is, because the first sub light emitting elements LD21 may be normally lit by receiving the driving signal provided along a third path PATH3, the non-emission area due to the repair may be reduced or minimized.

In one or more embodiments two first areas CNE21 may be spaced from each other are connected by two second areas CNE22 and the first conductive pattern CP1 and the first area CNE21 are connected by one second area CNE22 is exemplified, but a disposition and the number of the second areas CNE22 are not limited thereto. The second area CNE22 may be integrally formed with the first area CNE21. That is, the second area CNE22 and the first area CNE21 may be formed of the same conductive layer.

Figure 23:
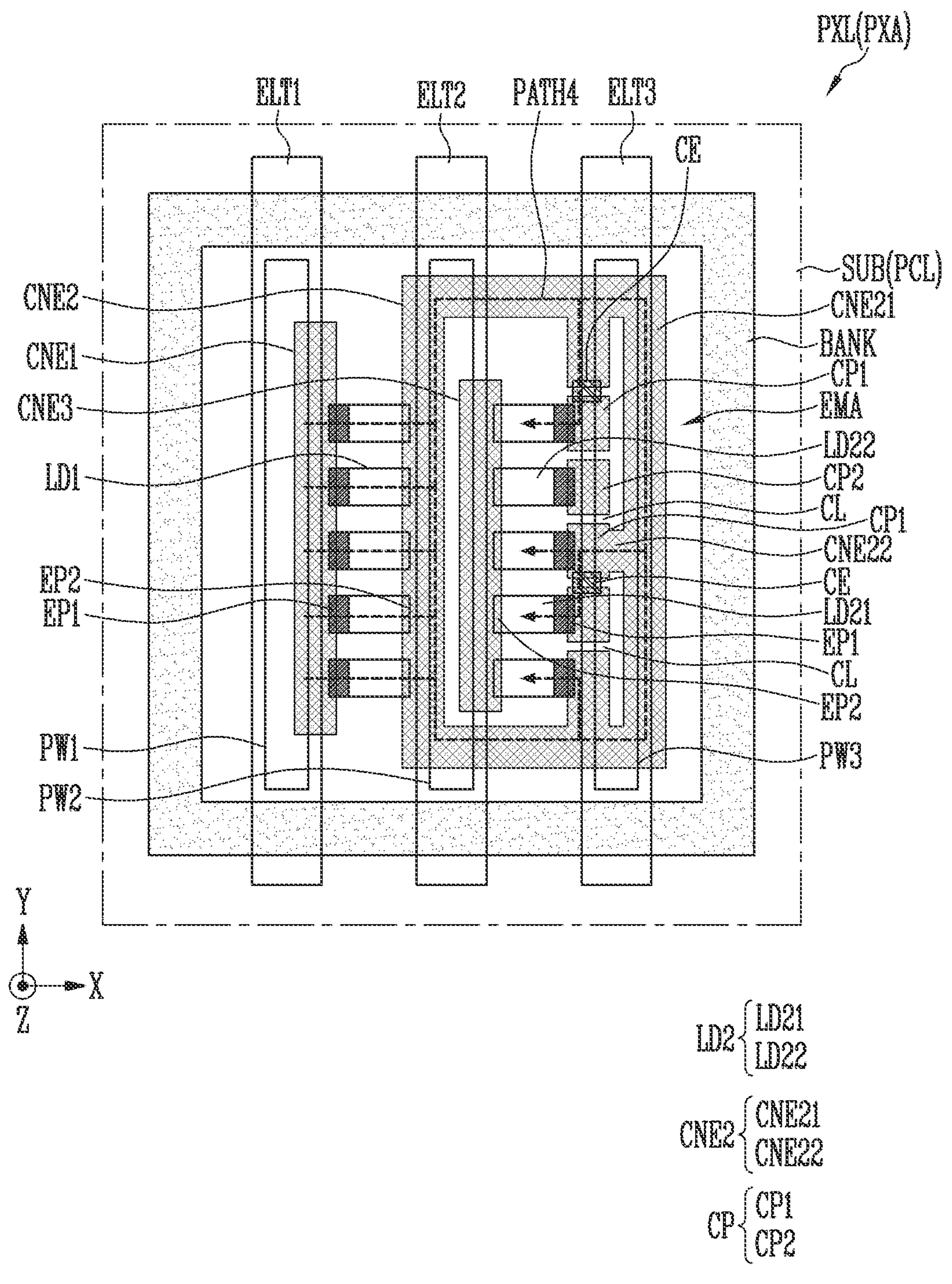
FIG. 23 is a plan view illustrating a pixel according to one or more embodiments.

FIG. 23 is a plan view illustrating a pixel according to one or more embodiments.

Referring to FIG. 23, the pixel PXL according to the present embodiment is different from the embodiment of FIGS. 21 and 22 in that the pixel PXL according to the present embodiment further includes a connection electrode CE electrically connecting the conductive pattern CP and the second contact electrode CNE2.

Specifically, the first area CNE21 may be partially disconnected by the plurality of cutting lines CL. The conductive pattern CP may be positioned between the cutting lines CL. The conductive pattern CP may be a portion in which the first area CNE21 is disconnected by the cutting line CL. The conductive pattern CP may include a first conductive pattern CP1 and a second conductive pattern CP2 electrically separated from each other. The first conductive pattern CP1 and the second conductive pattern CP2 may be spaced from each other by the cutting line CL and may be electrically separated from each other. The first conductive pattern CP1 may be in contact with the first end EP1 of the first sub light emitting element LD21 of the second light emitting element LD2, and the second conductive pattern CP2 may be in contact with the first end EP1 of the second sub light emitting element LD22 of the second light emitting element LD2. The second conductive pattern CP2 connected to the second sub light emitting element LD22, that is, the defective light emitting element may be disconnected from the first area CNE21 and the first conductive pattern CP1 by the cutting line CL. Accordingly, because the second conductive pattern CP2 may be floated, the lighting defect of the pixel PXL may be repaired even though a defective light emitting element exists as described above.

The first conductive pattern CP1 may be electrically connected to the first electrode ELT1 and the second electrode ELT2 by the second area CNE22 and/or the connection electrode CE. For example, a portion of the first conductive pattern CP1 may have one end that is in contact with the first end EP1 of the first sub light emitting element LD21 and another end that is in contact with the second area CNE22. One end of the second area CNE22 may be connected to the first conductive pattern CP1, and another end of the second area CNE22 may be connected to the first area CNE21. Accordingly, the first conductive pattern CP1 may be electrically connected to the first electrode ELT1 and the second electrode ELT2 through the first area CNE21 and the second area CNE22. In addition, another portion of the first conductive pattern CP1 may have one end that is in contact with the first end EP1 of the first sub light emitting element LD21 and another end that is in contact with the connection electrode CE. One end of the connection electrode CE may be connected to one end of the first conductive pattern CP1, and another end of the connection electrode CE may be connected to one end of the first area CNE21. Accordingly, the first conductive pattern CP1 may be electrically connected to the first electrode ELT1 and the second electrode ELT2 through the connection electrode CE. That is, even though the cutting line CL is formed between the first sub light emitting elements LD21 in the repair process, the first sub light emitting elements LD21 may be electrically connected to the first electrode ELT1 and the second electrode ELT2 by the second area CNE22 and/or the connection electrode CE. That is, because the first sub light emitting elements LD21 may be normally lit by receiving the driving signal provided along a fourth path PATH4, the non-emission area due to the repair may be reduced or minimized as described above.

Figure 24:
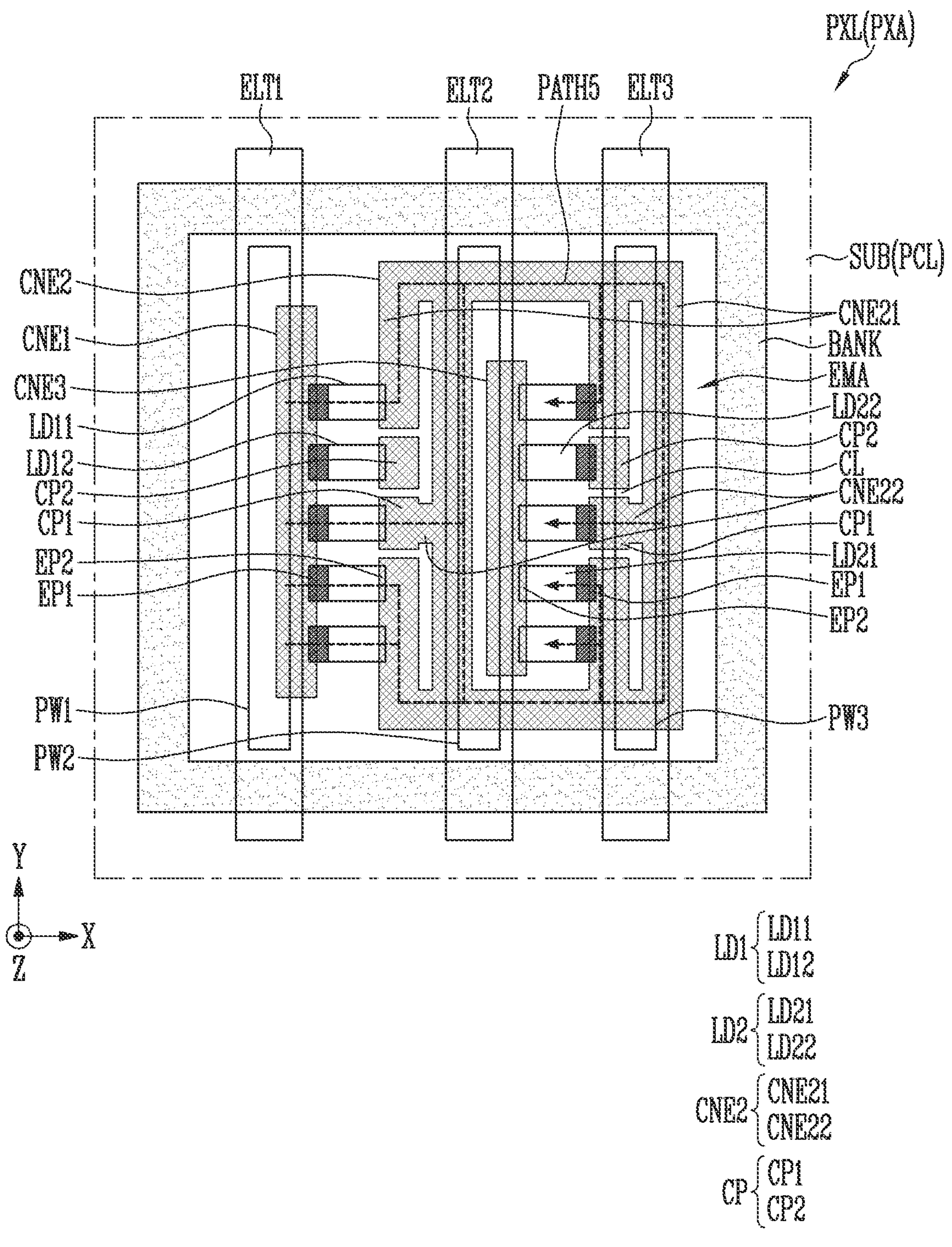
FIG. 24 is a plan view illustrating a pixel according to one or more embodiments.

FIG. 24 is a plan view illustrating a pixel according to one or more embodiments.

Referring to FIG. 24, the pixel PXL according to the present embodiment is different from the embodiment of FIGS. 21 and 22, in that the second contact electrode CNE2 further includes a first area CNE21 disposed on a side of the second end EP2 of the first light emitting element LD1.

Specifically, the second contact electrode CNE2 may include a plurality of first areas CNE21 spaced from each other. The first areas CNE21 may extend along the second direction (Y-axis direction) and may be disposed to be spaced from each other in the first direction (X-axis direction). In the drawing, a case in which the second contact electrode CNE2 includes a pair of first areas CNE21 disposed on a side of the second end EP2 of the first light emitting element LD1 and a pair of first areas CNE21 disposed on a side of the first end LD1 of the second light emitting element LD2 is exemplified, but a disposition and the number of the first areas CNE21 are not limited thereto.

The first area CNE21 may be partially disconnected by the plurality of cutting lines CL. The conductive pattern CP may be positioned between the cutting lines CL. The conductive pattern CP may be a portion in which the first area CNE21 is disconnected by the cutting line CL. That is, the conductive pattern CP and the first area CNE21 may be formed of the same conductive material. The conductive pattern CP may be disposed on the side of the second end EP2 of the first light emitting element LD1 and/or the side of the first end EP1 of the second light emitting element LD2. The conductive pattern CP may include a first conductive pattern CP1 and a second conductive pattern CP2 electrically separated from each other. The first conductive pattern CP1 and the second conductive pattern CP2 may be spaced from each other by the cutting line CL and may be electrically separated from each other. One end of a portion of the first conductive pattern CP1 may be in contact with the second end EP2 of the first sub light emitting element LD11 of the first light emitting element LD1, and another end may be in contact with the second area CNE22. One end of another portion of the first conductive pattern CP1 may be in contact with the first end EP1 of the first sub light emitting element LD21 of the second light emitting element LD2, and another end may be in contact with the second area CNE22. One end of a portion of the second conductive pattern CP2 may be in contact with the second end EP2 of the second sub light emitting element LD12 of the first light emitting element LD1. One end of another portion of the second conductive pattern CP2 may be in contact with the first end EP1 of the second sub light emitting element LD22 of the second light emitting element LD2, and another end may be in contact with the third electrode ELT3. As the second conductive pattern CP2 is disconnected from the first area CNE21 and the first conductive pattern CP1 by the cutting line CL, the second conductive pattern CP2 connected to the end of the second sub light emitting elements LD12 and LD22 may be floated. Accordingly, even though the second sub light emitting elements LD12 and LD22, that is, defective light emitting elements exist, the lighting defect of the pixel PXL may be repaired by disconnecting the second conductive pattern CP2.

The second area CNE22 may be disposed between the first areas CNE21 that are spaced from each other. The first areas CNE21 spaced from each other may be electrically connected by the second area CNE22. One end of the second area CNE22 may be connected to one of the first areas CNE21, and another end of the second area CNE22 may be connected to the other one of the first areas CNE21.

In addition, the second area CNE22 may be disposed between the first area CNE21 and the conductive pattern CP. For example, as shown in FIG. 24, the second area CNE22 may be disposed between the first area CNE21 and the first conductive pattern CP1. The first area CNE21 and the first conductive pattern CP1 that are spaced from each other may be electrically connected to each other by the second area CNE22. One end of the second area CNE22 may be connected to the first area CNE21, and another end of the second area CNE22 may be connected to the first conductive pattern CP1. Accordingly, even though the first conductive pattern CP1 is disconnected from a portion of the first area CNE21 in the repair process, the first conductive pattern CP1 may be electrically connected to the remaining portion of the first area CNE21 by the second area CNE22. That is, the first sub light emitting elements LD11 and LD21 may be electrically connected to the first electrode ELT1 and the second electrode ELT2 by the second area CNE22. That is, because the first sub light emitting elements LD11 and LD21 may be normally lit by receiving the driving signal provided along a fifth path PATH5, the non-emission area due to the repair may be reduced or minimized.

In the drawing, a case in which a pair of first areas CNE21 spaced from each other are respectively connected by two second areas CNE22 and the first conductive pattern CP1 and the first area CNE21 are connected by one second area CNE22 is exemplified, but a disposition and the number of the second areas CNE22 are not limited thereto. The second area CNE22 may be integrally formed with the first area CNE21. That is, the second area CNE22 and the first area CNE21 may be formed of the same conductive layer.

Figure 25:
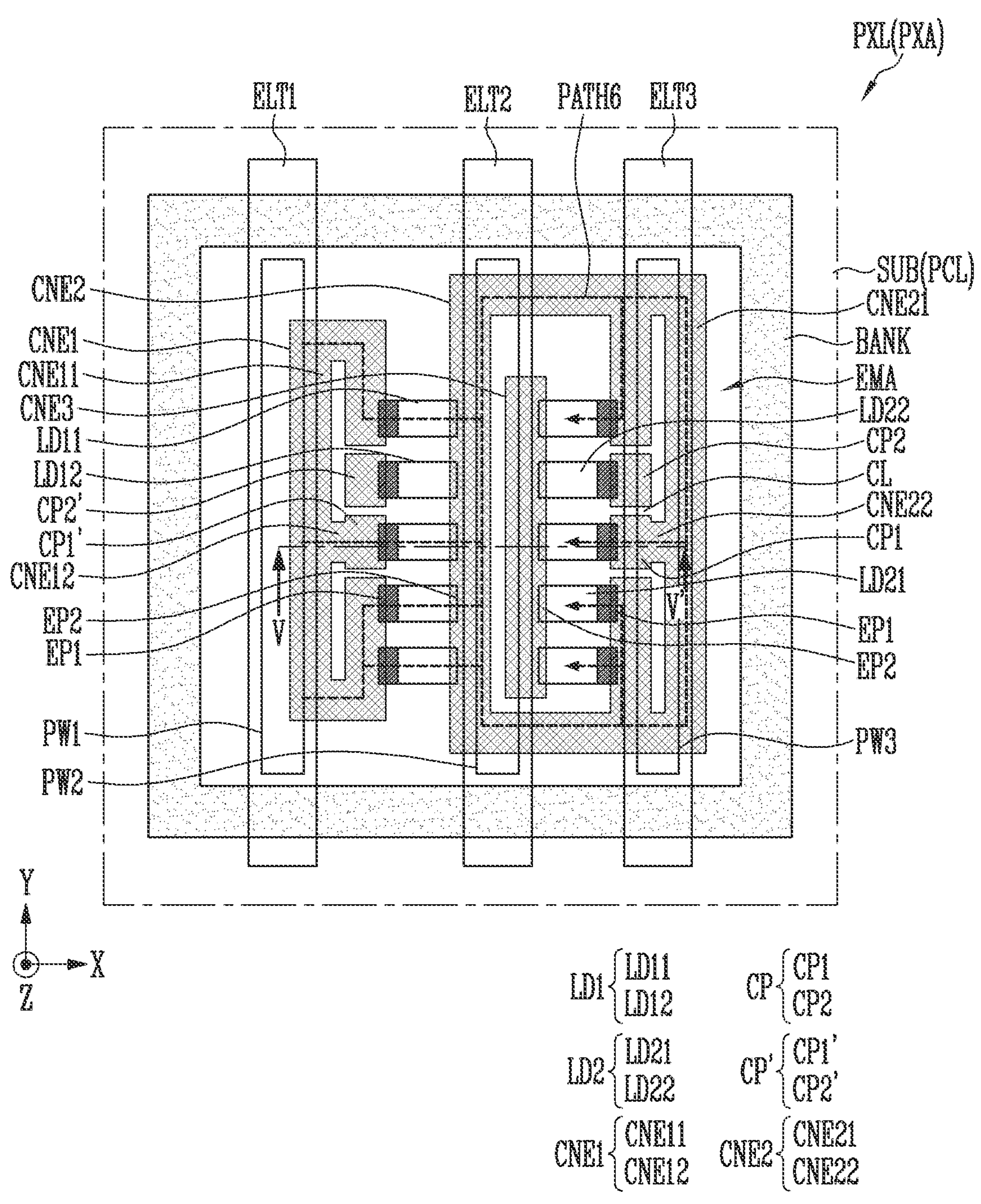
FIG. 25 is a plan view illustrating a pixel according to one or more embodiments.
Figure 26:
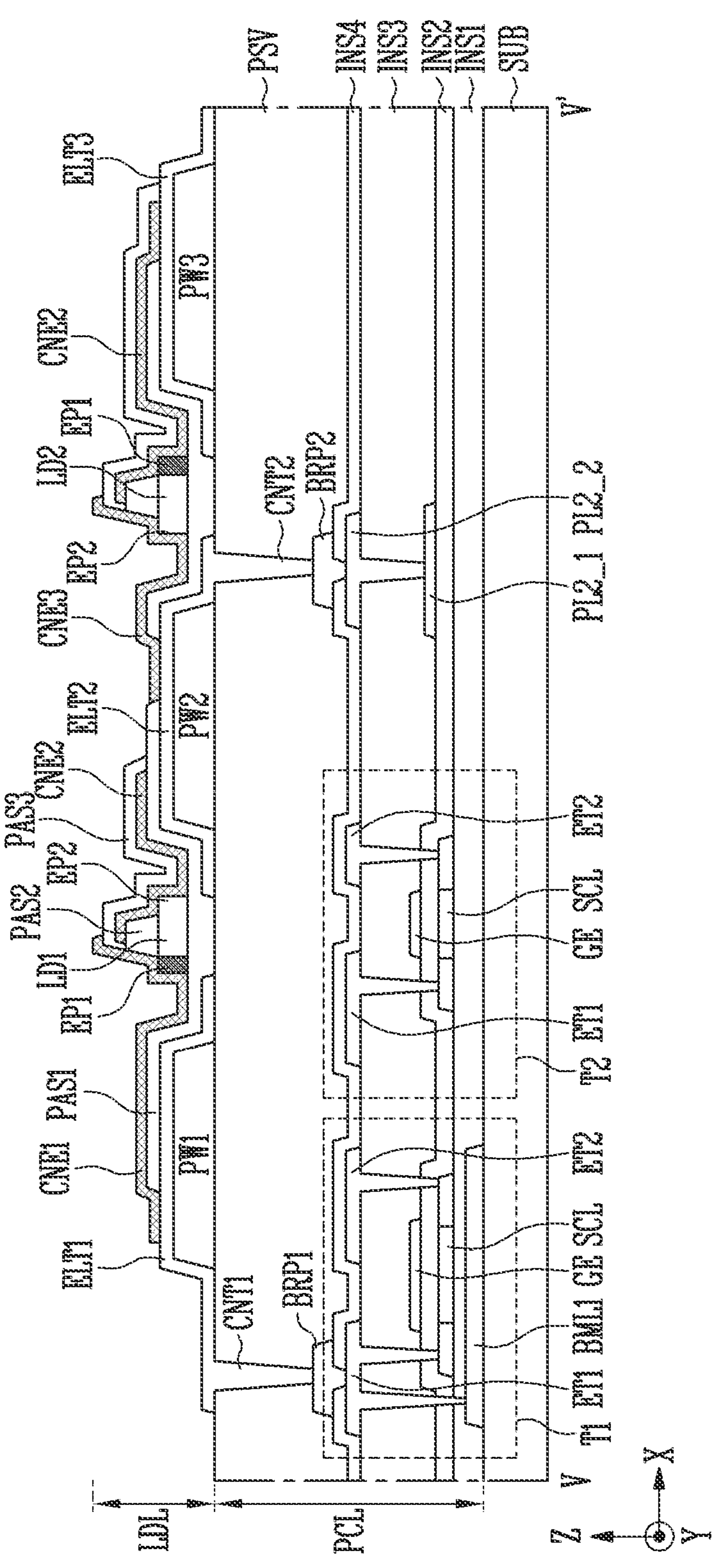
FIG. 26 is a cross-sectional view taken along the line V-V' of FIG. 25.

FIG. 25 is a plan view illustrating a pixel according to one or more embodiments. FIG. 26 is a cross-sectional view taken along the line V-V of FIG. 25.

Referring to FIGS. 25 and 26, the pixel PXL according to the present embodiment is different from the embodiment of FIGS. 21 and 22, in that the first contact electrode CNE1 includes a plurality of first areas CNE11 spaced apart from each other and at least one second area CNE12 disposed between the first areas CNE11.

Specifically, the first contact electrode CNE1 may include at least two first areas CNE11 spaced from each other. The first areas CNE11 may extend along the second direction (Y-axis direction) and may be disposed to be spaced from each other in the first direction (X-axis direction). In the drawing, a case in which the first contact electrode CNE1 has two first areas CNE11 disposed on a side of the first end EP1 of the first light emitting element LD1 is exemplified, but the number of the first areas CNE11 is not limited thereto.

The first area CNE11 may be partially disconnected by the plurality of cutting lines CL. A conductive pattern CP' may be positioned between the cutting lines CL. The conductive pattern CP' may be a portion in which the first area CNE11 is disconnected by the cutting line CL. That is, the conductive pattern CP' and the first area CNE11 may be formed of the same conductive material. The conductive pattern CP' may include a first conductive pattern CP1' and a second conductive pattern CP2' electrically separated from each other. The first conductive pattern CP1' and the second conductive pattern CP2' may be spaced from each other by the cutting line CL and may be electrically separated from each other. One end of the first conductive pattern CP1' may be in contact with the first end EP1 of the first sub light emitting element LD11 of the first light emitting element LD1, and another end of the first conductive pattern CP1' may be in contact with the second area CNE12. One end of the second conductive pattern CP2' may be in contact with the first end EP1 of the second sub light emitting element LD12 of the first light emitting element LD1. As the second conductive pattern CP2' is disconnected from the first area CNE11 and the first conductive pattern CP1' by the cutting line CL, the second conductive pattern CP2' connected to the first end EP1 of the second sub light emitting element LD12 may be floated. Therefore, even though the second sub light emitting element LD12, that is, a defective light emitting element exists, the lighting defect of the pixel PXL may be repaired by disconnecting the second conductive pattern CP2'.

The second area CNE12 may be disposed between the first areas CNE11 that are spaced from each other. The first areas CNE11 spaced from each other may be electrically connected to each other by the second areas CNE12. One end of the second area CNE12 may be connected to one of the first areas CNE11, and another end of the second area CNE12 may be connected to the first conductive pattern CP1'.

In addition, the second area CNE12 may be disposed between the first area CNE11 and the conductive pattern CP'. For example, as shown in FIG. 25, the second area CNE12 may be disposed between the first area CNE11 and the first conductive pattern CP1'. The first area CNE11 and the first conductive pattern CP1' that are spaced from each other may be electrically connected to each other by the second area CNE12. One end of the second area CNE12 may be connected to the first area CNE11, and another end of the second area CNE12 may be connected to the first conductive pattern CP1'. Accordingly, even though the first conductive pattern CP1' is disconnected from a portion of the first area CNE11 in the repair process, the first conductive pattern CP1' may be electrically connected to the remaining portion of the first area CNE11 by the second area CNE12. That is, the first sub light emitting element LD11 may be electrically connected to the first electrode ELT1 and the second electrode ELT2 by the second area CNE12. That is, because the first sub light emitting elements LD11 may be normally lit by receiving the driving signal provided along a sixth path PATH6, the non-emission area due to the repair may be reduced or minimized.

In one or more embodiments, two first areas CNE11 spaced from each other are connected by two second areas CNE12 and the first conductive pattern CP1' and the first area CNE11 are connected by one second area CNE12 is exemplified, but a disposition and the number of the second areas CNE12 are not limited thereto. The second area CNE12 may be integrally formed with the first area CNE11. That is, the second area CNE12 and the first area CNE11 may be formed of the same conductive layer.

Subsequently, a method of repairing a display device according to the above-described embodiments is described.

Figure 27:
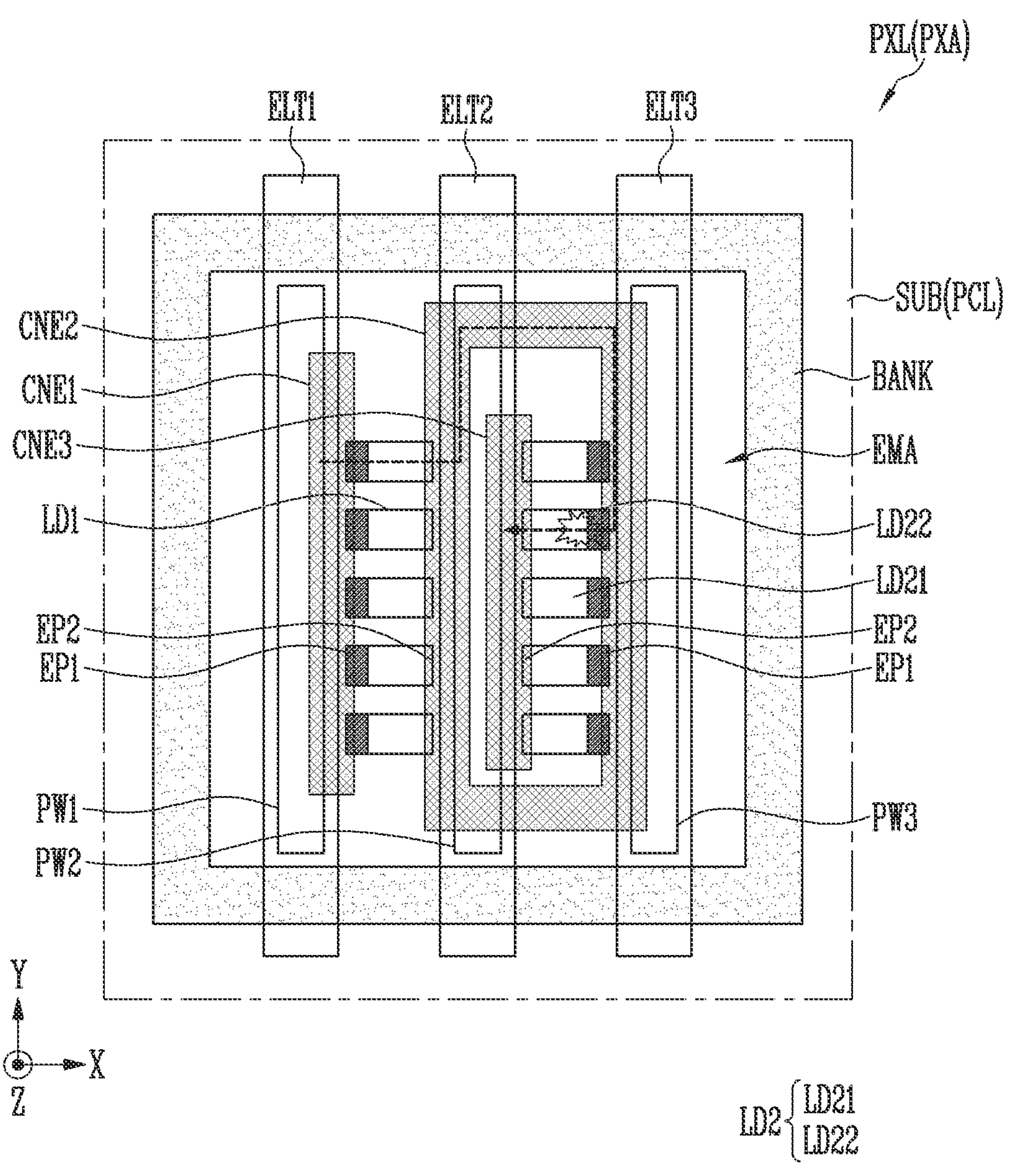
FIGS. 27 to 29 are plan views illustrating a method of repairing a display device according to one or more embodiments.
Figure 28:
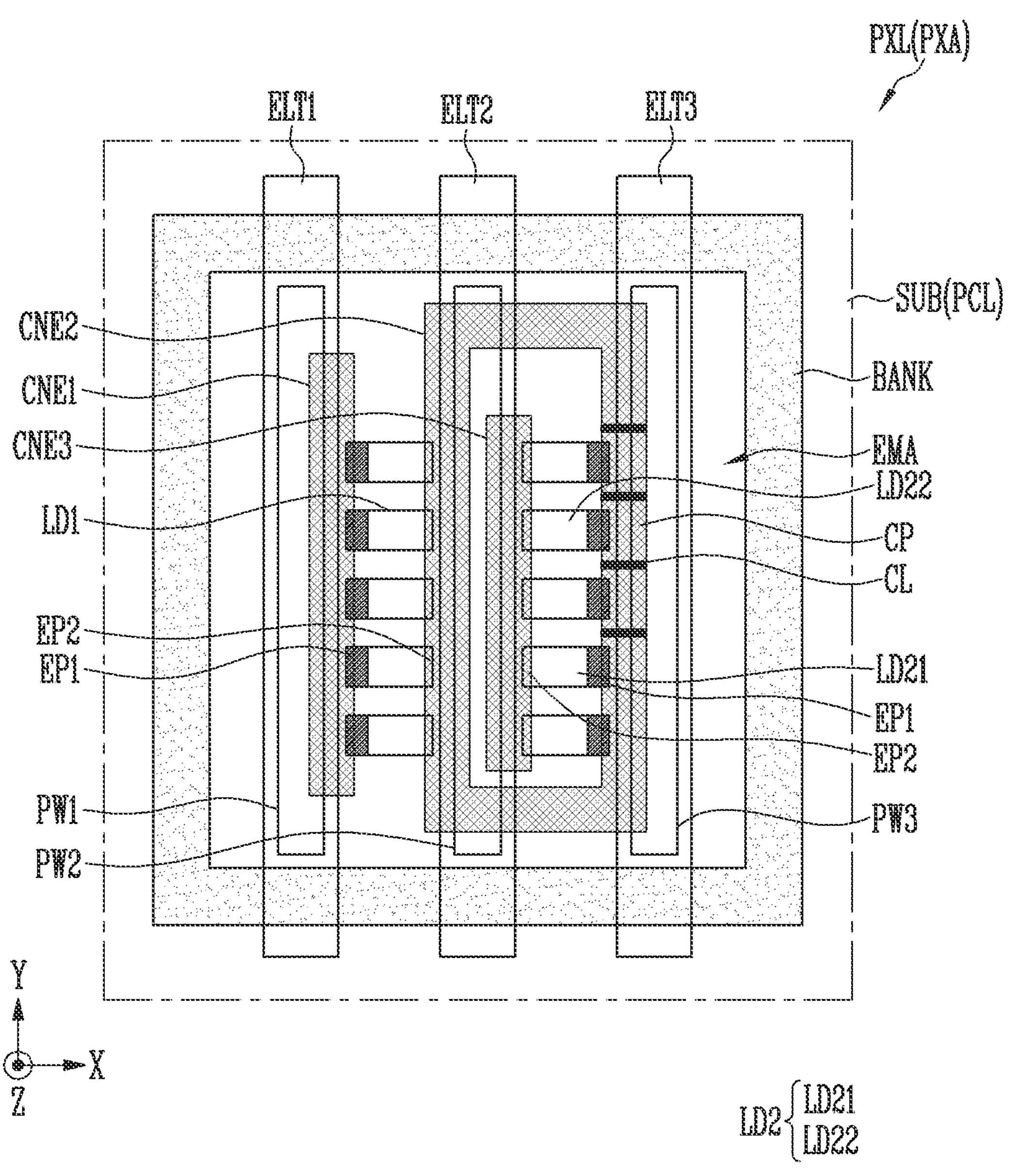
Figure 29:
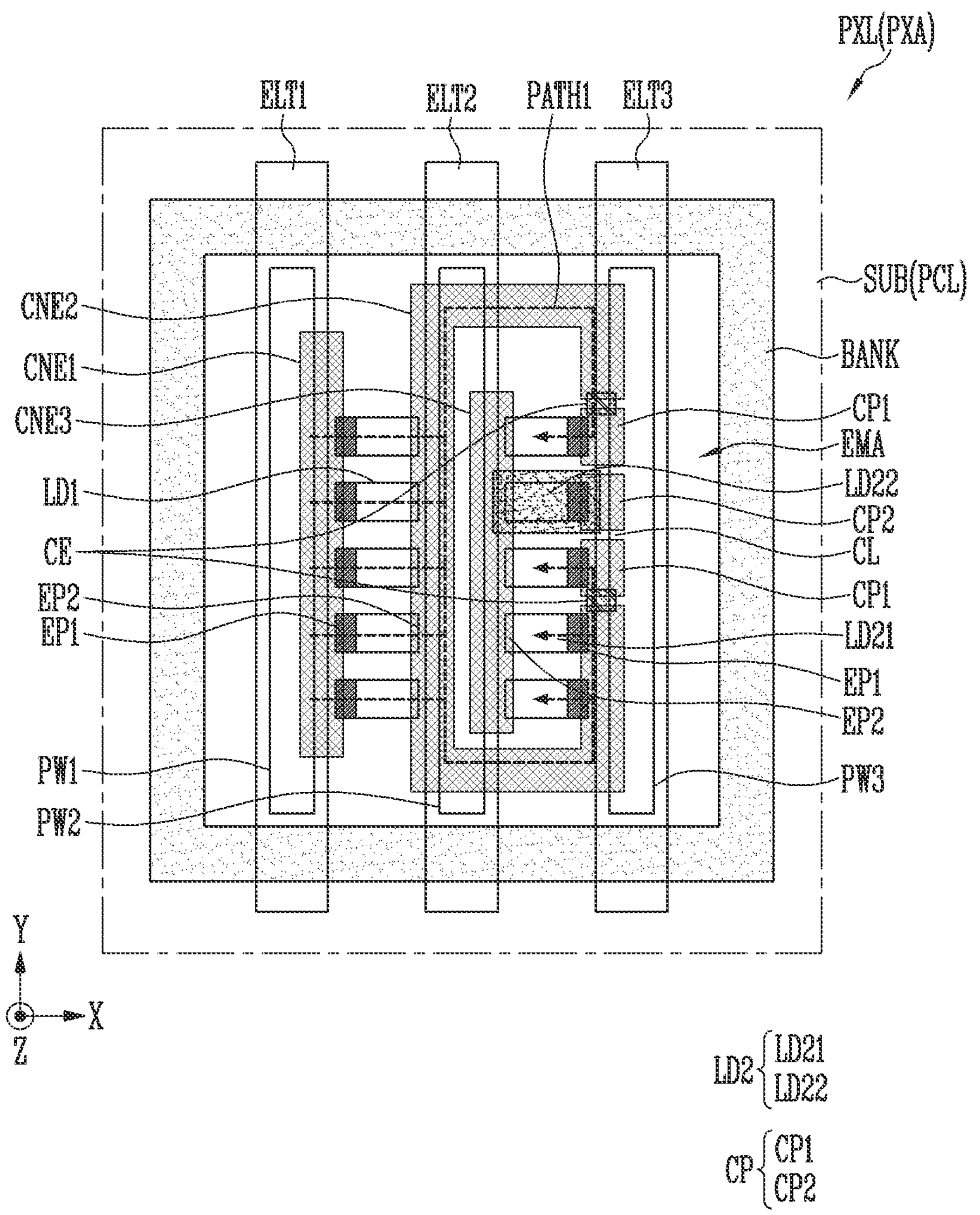

FIGS. 27 to 29 are plan views illustrating a method of repairing a display device according to one or more embodiments.

First, referring to FIG. 27, when the second sub light emitting element LD22, that is, a defective light emitting element, exists in the pixel PXL, the first electrode ELT1 and the second electrode ELT2 may be shorted by the second sub light emitting element LD22. In this case, a defect in which light is not lit up to the first sub light emitting element LD21 may occur.

Accordingly, the method of repairing the display device according to one or more embodiments may float the conductive pattern CP connected to the first end EP1 of the second sub light emitting element LD22 of the second light emitting element LD2 by disconnecting the second contact electrode CNE2 connected to the first end EP1 of the second light emitting element LD2 as shown in FIG. 28.

Specifically, by sequentially forming the cutting lines CL on one side and another side of the first end EP1 of the second light emitting element LD2, it may be disconnected while checking a position of the second sub light emitting element LD22, that is, the defective light emitting element. The cutting lines CL may be formed through a process such as laser cutting, but is not necessarily limited thereto. According to one or more embodiments, when the position of the second sub light emitting element LD22 may be specified, only the conductive pattern CP connected to the first end EP1 of the second sub light emitting element LD22 may be floated by partially forming the cutting line CL only on one side and another side of the first end EP1 of the second sub light emitting element LD22. Accordingly, the lighting defect of the pixel PXL due to the second sub light emitting element LD22 may be repaired as described above.

Subsequently, referring to FIG. 29, in the repair process, the first conductive pattern CP1 connected to the first sub light emitting element LD21 and the second conductive pattern CP2 connected to the second sub light emitting element LD22 may be separated by the cutting line CL. Accordingly, the method of repairing the display device according to one or more embodiments may further include forming the connection electrode CE for connecting the first sub light emitting element LD21 and the second contact electrode CNE2.

The connection electrode CE may be formed to overlap the cutting line CL. For example, the connection electrode CE may be formed to overlap one end of the first conductive pattern CP1 disconnected by the cutting line CL and one end of the second contact electrode CNE2. The connection electrode CE may be in contact with one end of the first conductive pattern CP1 disconnected by the cutting line CL and one end of the second contact electrode CNE2. Accordingly, the first conductive pattern CP1 disconnected by the cutting line CL and the second contact electrode CNE2 may be electrically connected to each other by the connection electrode CE. In this case, the first sub light emitting elements LD21 may be electrically connected to the first electrode ELT1 and the second electrode ELT2 by the connection electrode CE. That is, because the first sub light emitting elements LD21 may be normally lit by receiving the driving signal provided along the first path PATH1, the non-emission area due to the repair may be reduced or minimized as described above. According to one or more embodiments, when a position of the second sub light emitting element LD22 may be specified, because the cutting line CL may be partially formed only on one side and another side of the first end EP1 of the second sub light emitting element LD22, the connection electrode CE for connecting the first sub light emitting element LD21 may be omitted.

Figure 30:
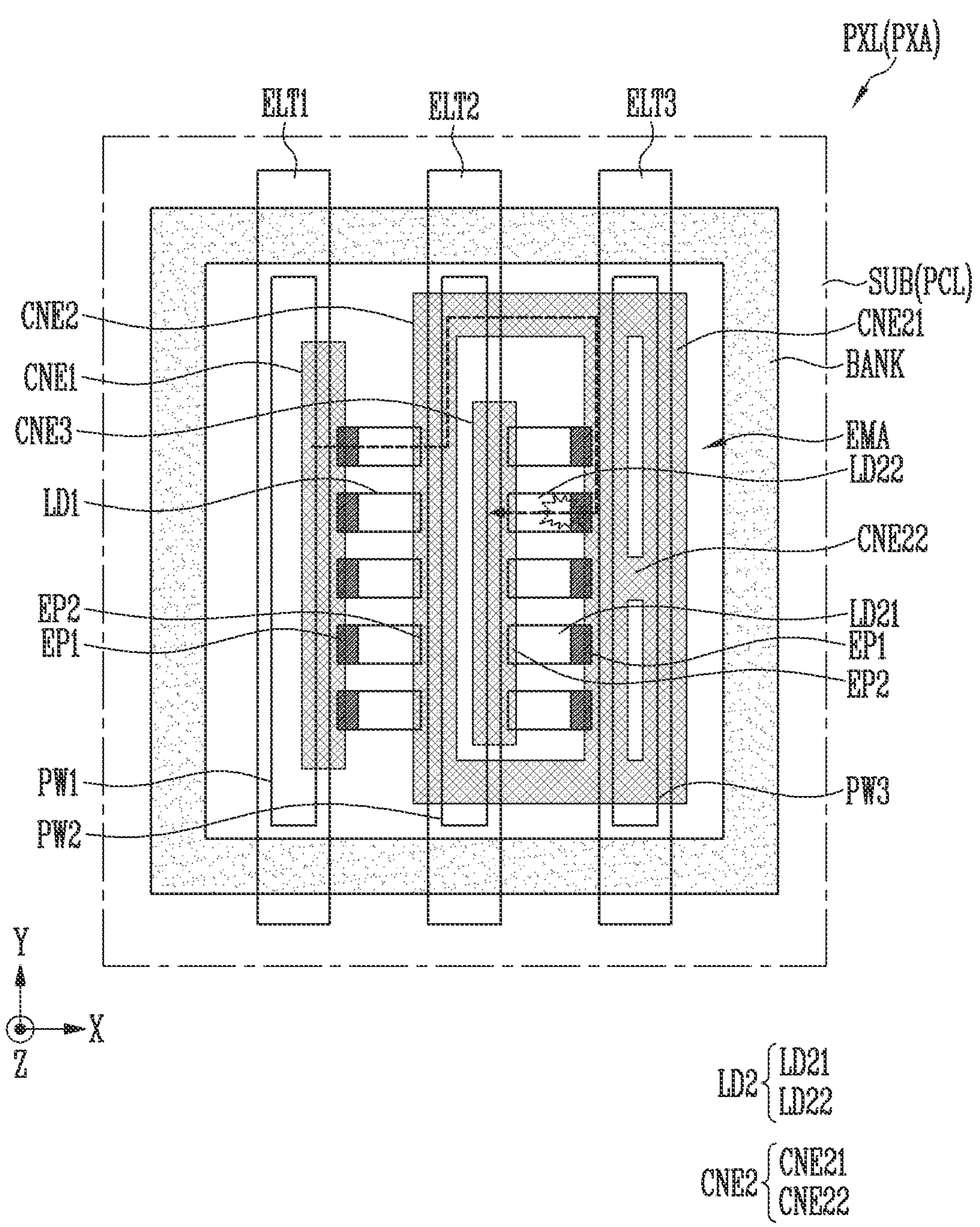
FIGS. 30 to 32 are plan views illustrating a method of repairing a display device according to another embodiment.
Figure 31:
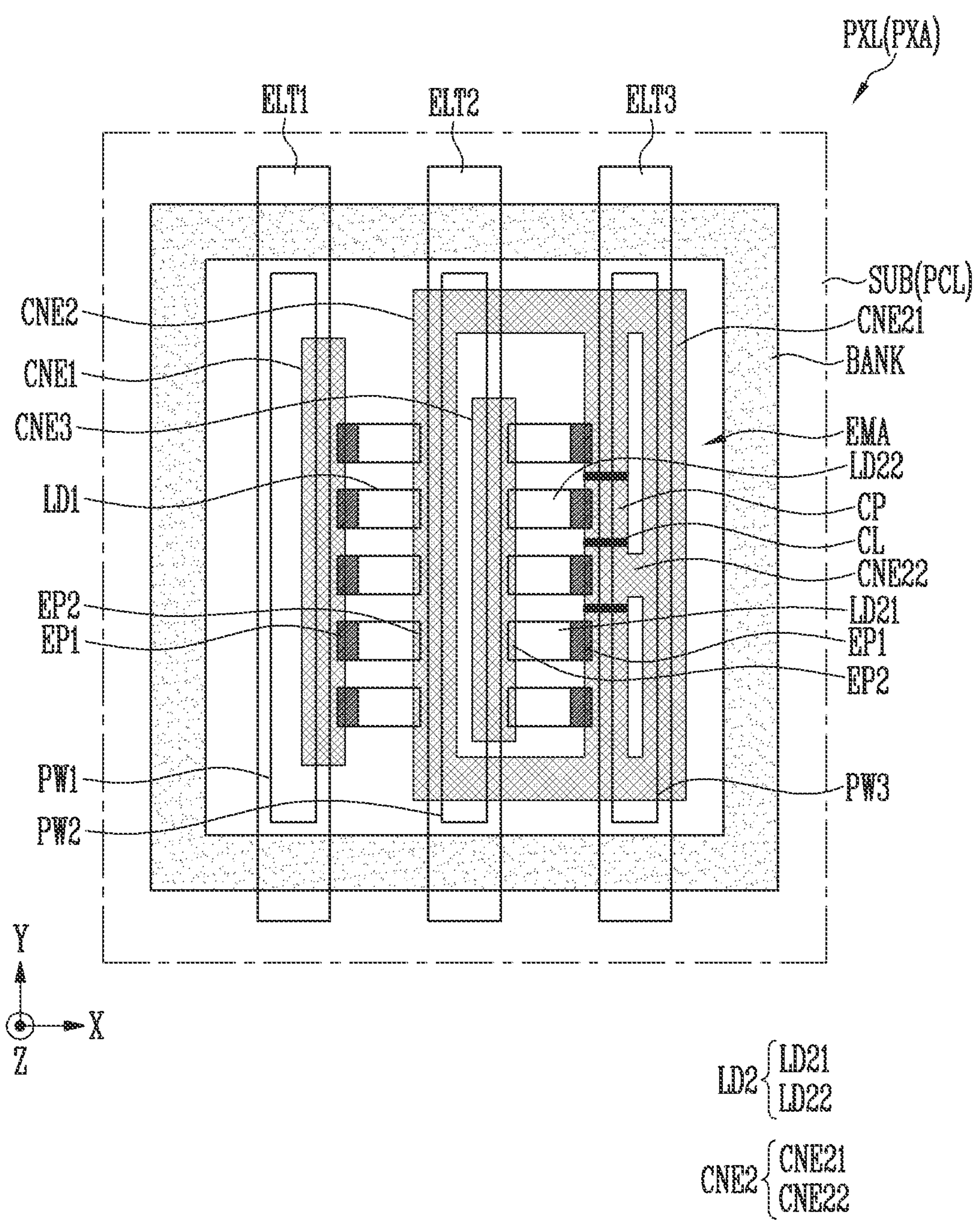
Figure 32:
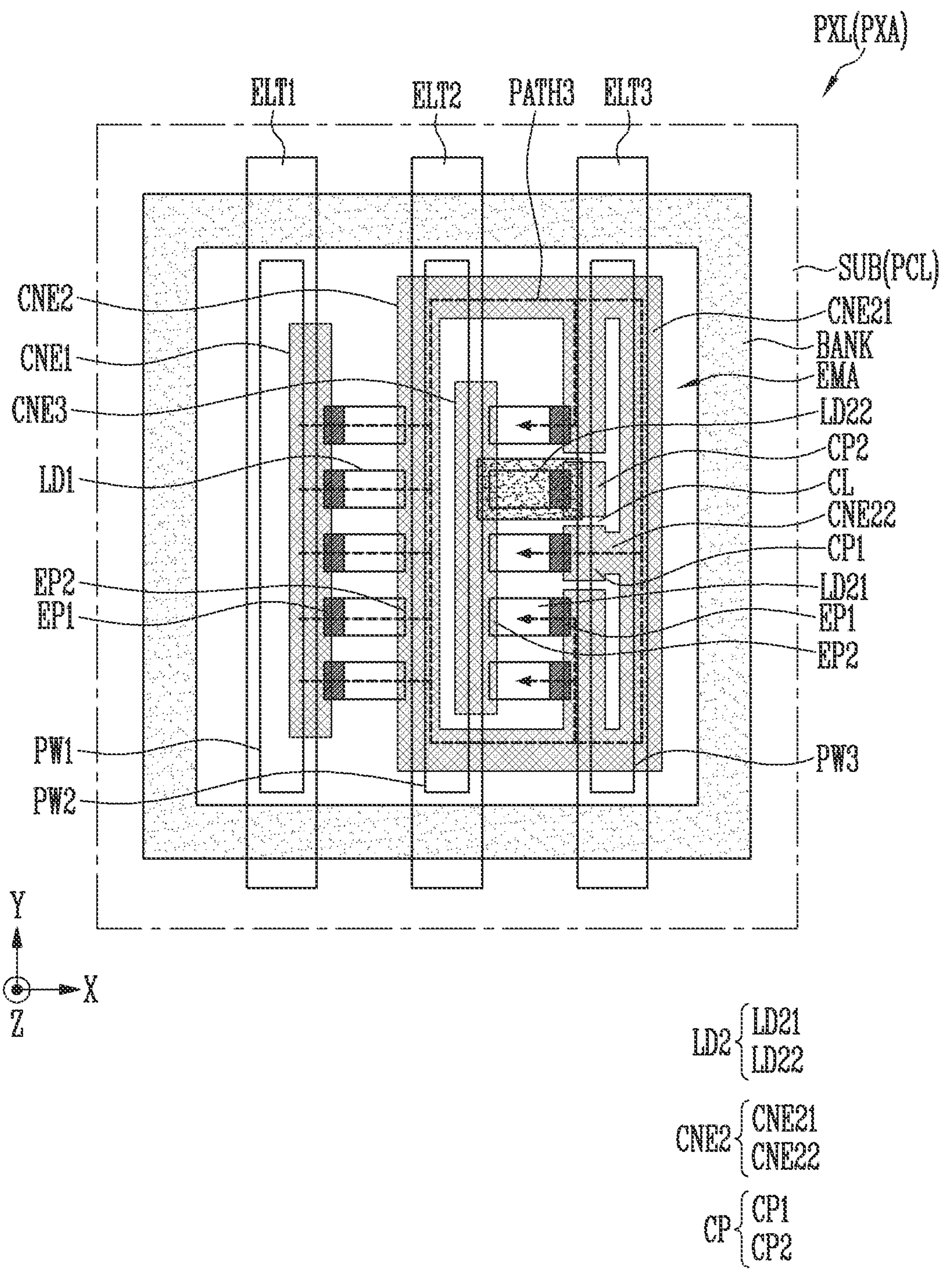

FIGS. 30 to 32 are plan views illustrating a method of repairing a display device according to one or more embodiments.

First, referring to FIG. 30, when the second sub light emitting element LD22 exists in the pixel PXL, the first electrode ELT1 and the second electrode ELT2 may be shorted by the second sub light emitting element LD22. In this case, a defect in which light is not lit up to the first sub light emitting element LD21 may occur.

Referring to FIG. 31, when the second contact electrode CNE2 includes at least two first areas CNE21 and the second area CNE22 connecting the first areas CNE21, the conductive pattern CP connected to the second sub light emitting element LD22 may be floated by disconnecting the conductive pattern CP connected to the first end EP1 of the second light emitting element LD2 from the first area CNE21.

As described above, the first area CNE21 may be disconnected while checking a position of the second sub light emitting element LD22 by sequentially forming the cutting lines CL on one side and another side of the first end EP1 of the second light emitting element LD2. The cutting lines CL may be formed through a process such as laser cutting, but is not limited thereto. According to one or more embodiments, when the position of the second sub light emitting element LD22 may be specified, only the conductive pattern CP connected to the first end EP1 of the second sub light emitting element LD22 may be floated by partially forming the cutting line CL only on one side and another side of the first end EP1 of the second sub light emitting element LD22. Accordingly, the lighting defect of the pixel PXL due to the second sub light emitting element LD22 may be repaired as described above.

Subsequently, referring to FIG. 32, in the repair process, the first conductive pattern CP1 connected to the first sub light emitting element LD21 may be disconnected from a portion of the first area CNE21. At this time, the first conductive pattern CP1 may be electrically connected to the remaining portion of the area CNE21 by the second area CNE22. That is, the first sub light emitting element LD21 may be electrically connected to the first electrode ELT1 and the second electrode ELT2 by the second area CNE22. That is, because the first sub light emitting elements LD21 may be normally lit by receiving the driving signal provided along the third path PATH3, the non-emission area due to the repair may be reduced or minimized.

Those skilled in the art may understand that the present disclosure may be implemented in a modified form without departing from the above-described essential characteristic. Therefore, the disclosed methods should be considered in a description point of view not a limitation point of view. The scope of the present disclosure is shown in the claims not in the above description, and all differences within the scope will be construed as being included in the present disclosure.

The invention claimed is:

1. A display device comprising:

a substrate;

a first electrode, a second electrode, and a third electrode on the substrate and sequentially arranged along a first direction;

at least one first light emitting element between the first electrode and the second electrode;

at least one second light emitting element between the second electrode and the third electrode;

a first contact electrode that is in contact with the first electrode and one end of the first light emitting element;

a second contact electrode having one side that is in contact with another end of the first light emitting element and another side that is in contact with the third electrode and one end of the second light emitting element;

a third contact electrode that is in contact with the second electrode and another end of the second light emitting element; and at least one conductive pattern that is in contact with the third electrode and one end of the second light emitting element, wherein the second contact electrode bypasses the third contact electrode and extends around the third contact electrode, and wherein the conductive pattern is disconnected from the second contact electrode.

2. The display device according to claim 1, wherein the second contact electrode and the conductive pattern comprise a same conductive layer.

3. The display device according to claim 1, wherein the conductive pattern comprises a first conductive pattern and a second conductive pattern electrically separated from each other, and wherein the display device further comprises a connection electrode connecting the first conductive pattern and the second contact electrode.

4. The display device according to claim 3, wherein one end of the connection electrode is in contact with one end of the first conductive pattern, and another end of the connection electrode is in contact with the second contact electrode.

5. The display device according to claim 3, wherein the second electrode comprises a first conductive layer, the second contact electrode comprises a second conductive layer, the connection electrode comprises a third conductive layer, and the second conductive layer is between the first conductive layer and the third conductive layer.

* * * * *